United States Patent
Yu et al.

(10) Patent No.: US 12,080,615 B2
(45) Date of Patent: Sep. 3, 2024

(54) METHOD OF MANUFACTURING AN INTEGRATED FAN-OUT PACKAGE HAVING FAN-OUT REDISTRIBUTION LAYER (RDL) TO ACCOMMODATE ELECTRICAL CONNECTORS

(71) Applicant: Taiwan Semiconductor Manufacturing Co., Ltd., Hsinchu (TW)

(72) Inventors: Chen-Hua Yu, Hsinchu (TW); Kuo-Chung Yee, Taoyuan (TW); Hao-Yi Tsai, Hsinchu (TW); Tin-Hao Kuo, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 18/068,010

(22) Filed: Dec. 19, 2022

(65) Prior Publication Data
US 2023/0123427 A1    Apr. 20, 2023

Related U.S. Application Data

(63) Continuation of application No. 16/390,482, filed on Apr. 22, 2019, now Pat. No. 11,532,529, which is a
(Continued)

(51) Int. Cl.
*H01L 23/00* (2006.01)
*H01L 21/48* (2006.01)
(Continued)

(52) U.S. Cl.
CPC ........ *H01L 23/3114* (2013.01); *H01L 21/486* (2013.01); *H01L 23/5389* (2013.01);
(Continued)

(58) Field of Classification Search
None
See application file for complete search history.

(56) References Cited

U.S. PATENT DOCUMENTS

| 6,348,728 B1 * | 2/2002 | Aiba | H01L 23/49816 |
| | | | 257/E25.011 |
| 6,600,221 B2 * | 7/2003 | Kimura | H01L 24/49 |
| | | | 257/784 |

(Continued)

FOREIGN PATENT DOCUMENTS

| CN | 101452860 A | 6/2009 |
| CN | 102931102 A | 2/2013 |

(Continued)

OTHER PUBLICATIONS

Bantog, Ely et al., "Wire Bond, Flip-Chip, and Chip-Scale-Packaging Solution to High Silicon Integration," IEEE 56th Proceedings, Electronic Components and Technology Conference, May 30-Jun. 2, 2006, 6 pages.

*Primary Examiner* — Evren Seven
(74) *Attorney, Agent, or Firm* — Slater Matsil, LLP

(57) ABSTRACT

A method includes forming a through-via from a first conductive pad of a first device die. The first conductive pad is at a top surface of the first device die. A second device die is adhered to the top surface of the first device die. The second device die has a surface conductive feature. The second device die and the through-via are encapsulated in an encapsulating material. The encapsulating material is planarized to reveal the through-via and the surface conductive feature. Redistribution lines are formed over and electrically coupled to the through-via and the surface conductive feature.

12 Claims, 46 Drawing Sheets

Related U.S. Application Data continuation of application No. 16/053,133, filed on Aug. 2, 2018, now Pat. No. 10,269,674, which is a continuation of application No. 15/004,240, filed on Jan. 22, 2016, now Pat. No. 10,049,953.

(60) Provisional application No. 62/221,443, filed on Sep. 21, 2015.

(51) Int. Cl.
    *H01L 23/29*     (2006.01)
    *H01L 23/31*     (2006.01)
    *H01L 23/498*     (2006.01)
    *H01L 23/538*     (2006.01)
    *H01L 25/065*     (2023.01)
    *H01L 21/56*     (2006.01)

(52) U.S. Cl.
CPC .............. *H01L 24/19* (2013.01); *H01L 24/20* (2013.01); *H01L 24/24* (2013.01); *H01L 24/82* (2013.01); *H01L 24/94* (2013.01); *H01L 24/97* (2013.01); *H01L 25/0652* (2013.01); *H01L 21/561* (2013.01); *H01L 21/568* (2013.01); *H01L 23/295* (2013.01); *H01L 23/3128* (2013.01); *H01L 23/49816* (2013.01); *H01L 2224/04105* (2013.01); *H01L 2224/12105* (2013.01); *H01L 2224/13025* (2013.01); *H01L 2224/14181* (2013.01); *H01L 2224/16227* (2013.01); *H01L 2224/16265* (2013.01); *H01L 2224/214* (2013.01); *H01L 2224/24137* (2013.01); *H01L 2224/24147* (2013.01); *H01L 2224/32145* (2013.01); *H01L 2224/32225* (2013.01); *H01L 2224/32245* (2013.01); *H01L 2224/73204* (2013.01); *H01L 2224/73217* (2013.01); *H01L 2224/73267* (2013.01); *H01L 2224/81005* (2013.01); *H01L 2224/9222* (2013.01); *H01L 2224/92244* (2013.01); *H01L 2224/94* (2013.01); *H01L 2224/97* (2013.01); *H01L 2924/1431* (2013.01); *H01L 2924/1434* (2013.01); *H01L 2924/18162* (2013.01); *H01L 2924/19041* (2013.01)

(56) References Cited

U.S. PATENT DOCUMENTS

| | | | |
|---|---|---|---|
| 6,765,299 B2 * | 7/2004 | Takahashi | H01L 23/3107 257/688 |
| 8,110,899 B2 * | 2/2012 | Reed | H01L 25/0652 438/109 |
| 8,361,842 B2 | 1/2013 | Yu et al. | |
| 8,604,568 B2 | 12/2013 | Stacey | |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 9,190,391 B2 | 11/2015 | Kelkar et al. | |
| 9,373,527 B2 | 6/2016 | Yu et al. | |
| 9,379,074 B2 | 6/2016 | Uzoh et al. | |
| 9,431,367 B2 | 8/2016 | Lin et al. | |
| 9,496,196 B2 | 11/2016 | Yu et al. | |
| 9,583,456 B2 * | 2/2017 | Uzoh | H01L 24/97 |
| 9,589,930 B2 | 3/2017 | Park et al. | |
| 9,589,938 B2 | 3/2017 | Chen et al. | |
| 9,679,882 B2 | 6/2017 | Tung et al. | |
| 9,917,072 B2 | 3/2018 | Yu et al. | |
| 10,049,953 B2 | 8/2018 | Yu et al. | |
| 10,128,213 B2 | 11/2018 | Yu et al. | |
| 10,269,674 B2 | 4/2019 | Yu et al. | |
| 10,784,178 B2 | 9/2020 | Ko et al. | |
| 2002/0167079 A1 | 11/2002 | Pu et al. | |
| 2004/0164385 A1 * | 8/2004 | Kado | H01L 23/5386 257/E23.079 |
| 2006/0091518 A1 | 5/2006 | Grafe et al. | |
| 2008/0164605 A1 * | 7/2008 | Wu | H01L 24/17 257/E23.079 |
| 2008/0174000 A1 | 7/2008 | Chen et al. | |
| 2009/0166836 A1 | 7/2009 | Kim et al. | |
| 2010/0193930 A1 | 8/2010 | Lee | |
| 2010/0314740 A1 | 12/2010 | Choi et al. | |
| 2011/0068427 A1 | 3/2011 | Paek et al. | |
| 2011/0291288 A1 | 12/2011 | Wu et al. | |
| 2012/0056316 A1 | 3/2012 | Pagaila et al. | |
| 2012/0139068 A1 | 6/2012 | Stacey | |
| 2012/0211892 A1 | 8/2012 | Kim et al. | |
| 2012/0273971 A1 * | 11/2012 | Usami | H01L 21/561 257/E23.141 |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0062783 A1 | 3/2013 | Lin | |
| 2013/0168848 A1 | 7/2013 | Lin et al. | |
| 2013/0307140 A1 | 11/2013 | Huang et al. | |
| 2013/0343022 A1 | 12/2013 | Hu et al. | |
| 2014/0203429 A1 | 7/2014 | Yu et al. | |
| 2014/0210099 A1 | 7/2014 | Hu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2015/0187705 A1 | 7/2015 | Chung | |
| 2015/0200182 A1 | 7/2015 | Wang et al. | |
| 2015/0270232 A1 * | 9/2015 | Chen | H01L 25/10 257/691 |
| 2015/0303174 A1 | 10/2015 | Yu et al. | |
| 2015/0318263 A1 | 11/2015 | Yu et al. | |
| 2015/0333038 A1 | 11/2015 | Hatakeyama | |
| 2016/0049385 A1 | 2/2016 | Yu et al. | |
| 2016/0293574 A1 | 10/2016 | Kim et al. | |
| 2019/0074261 A1 | 3/2019 | Yu et al. | |

FOREIGN PATENT DOCUMENTS

| | | | |
|---|---|---|---|
| CN | 103296009 A | | 9/2013 |
| CN | 103579171 A | | 2/2014 |
| CN | 104600064 A | | 5/2015 |
| CN | 104795386 A | | 7/2015 |
| CN | 104851841 A | | 8/2015 |
| CN | 106548948 A | | 3/2017 |
| KR | 20090074508 A | | 7/2009 |
| KR | 20130077033 A | | 7/2013 |
| TW | 201230266 A | | 7/2012 |

\* cited by examiner

METHOD OF MANUFACTURING AN INTEGRATED FAN-OUT PACKAGE HAVING FAN-OUT REDISTRIBUTION LAYER (RDL) TO ACCOMMODATE ELECTRICAL CONNECTORS

PRIORITY CLAIM AND CROSS-REFERENCE

This application is a continuation of U.S. patent application Ser. No. 16/390,482, entitled "Method of Manufacturing an Integrated Fan-out Package Having Fan-Out Redistribution Layer (RDL) to Accommodate Electrical Connectors," filed Apr. 22, 2019, which is a continuation of U.S. patent application Ser. No. 16/053,133, entitled "Method of Manufacturing an Integrated Fan-out Package Having Fan-Out Redistribution Layer (RDL) to Accommodate Electrical Connectors," filed Aug. 2, 2018, now U.S. Pat. No. 10,269,674 issued Apr. 23, 2019, which is a continuation of U.S. patent application Ser. No. 15/004,240, entitled "Method of Manufacturing an Integrated Fan-out Package Having Fan-Out Redistribution Layer (RDL) to Accommodate Electrical Connectors," filed Jan. 22, 2016, now U.S. Pat. No. 10,049,953 issued Aug. 14, 2018, which claims the benefit of the following provisionally filed U.S. Patent application: Application Ser. No. 62/221,443, filed Sep. 21, 2015, and entitled "Integrated Fan-Out Package and the Methods of Manufacturing," which applications are hereby incorporated herein by reference.

BACKGROUND

Stacked dies are commonly used in Three-Dimensional (3D) integrated circuits. Through the stacking of dies, the footprint (form factor) of packages is reduced. In addition, the metal line routing in the dies is significantly simplified through the formation of stacked dies.

In some applications, a plurality of dies is stacked to form a die stack, wherein the plurality of dies include Through-Substrate Vias (TSVs, sometimes known as through-silicon vias). The total count of the stacked dies may sometimes reach eight or more. When such a die stack is formed, a first die is first bonded onto a package substrate through flip-chip bonding, wherein solder regions/balls are reflowed to join the first die to the package substrate. A first underfill is dispensed into the gap between the first die and the package substrate. The first underfill is then cured. A test is then performed to ensure that the first die is connected to the package substrate properly, and that the first die and the package substrate function as desired.

Next, a second die is bonded onto the first die through flip-chip bonding, wherein solder regions/balls are reflowed to join the second die to the first die. A second underfill is dispensed into the gap between the second die and the first die. The second underfill is then cured. A test is then performed to ensure that the second die is connected to the first die and the package substrate correctly, and the first die, the second die, and the package substrate function as desired. Next, a third die is bonded onto the second die through the same process steps as for bonding the first die and the second die. The processes are repeated until all the dies are bonded.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
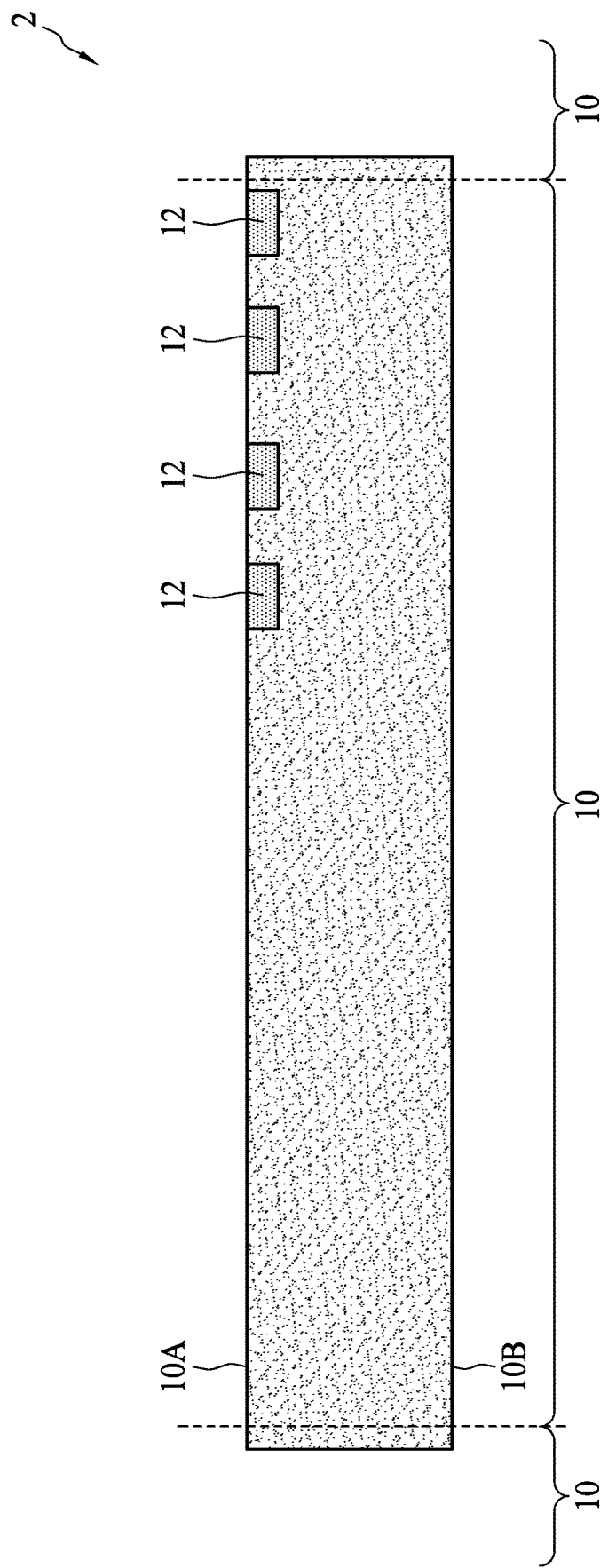
FIGS. 1A through 1I illustrate the cross-sectional views of intermediate stages in the formation of a fan-out package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated fan-out packages and the methods of forming the same are provided in accordance with various exemplary embodiments. The intermediate stages of forming the fan-out packages are illustrated. Some variations of some embodiments are discussed. Throughout the various views and illustrative embodiments, like reference numbers are used to designate like elements.

Figure 12:
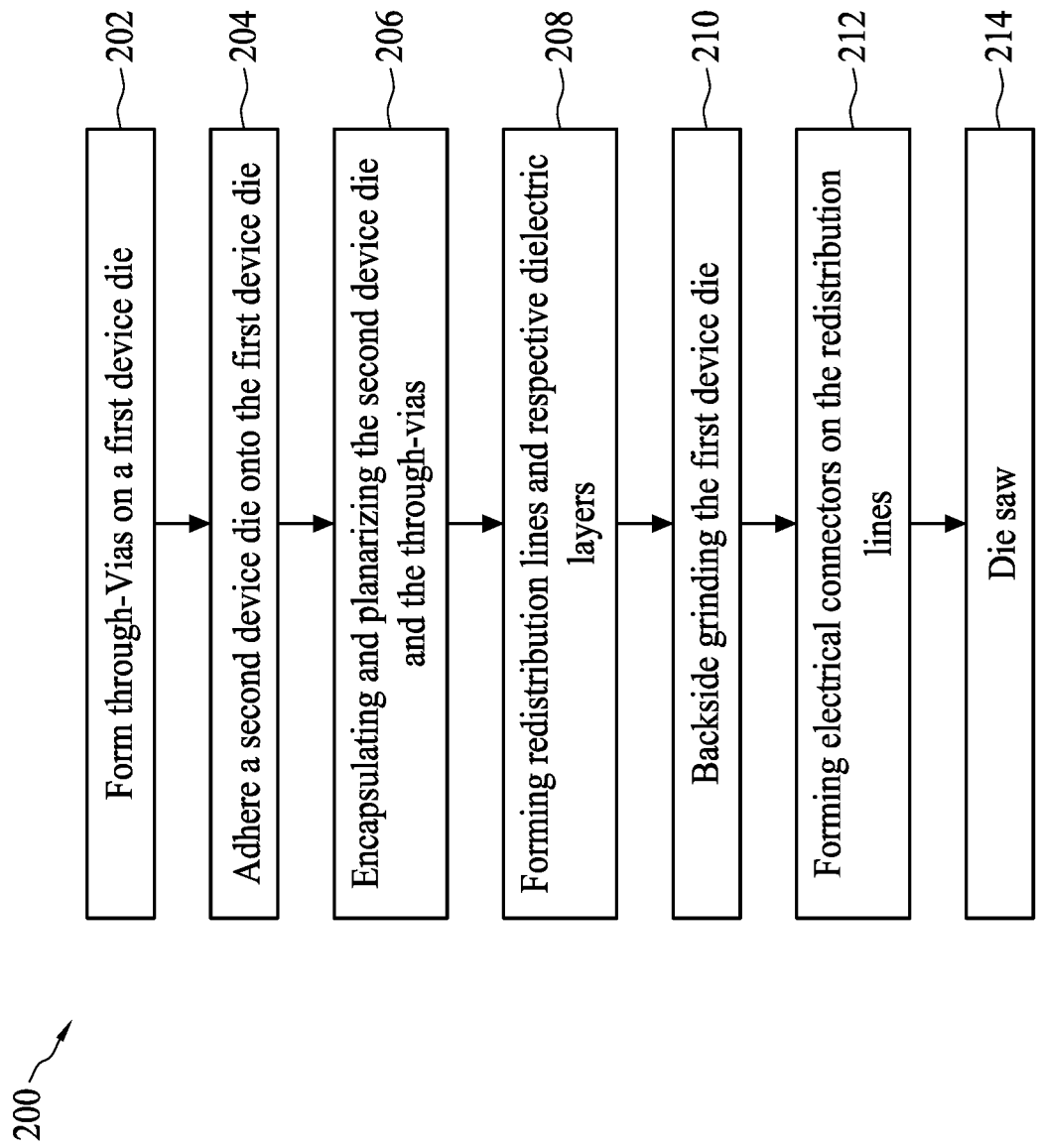
FIG. 12 illustrates a process flow for forming a fan-out package in accordance with some embodiments.

FIGS. 1A through 1I illustrate the cross-sectional views of intermediate stages in the formation of a fan-out package in accordance with some embodiments. The steps shown in FIGS. 1A through 1I are also illustrated schematically in the process flow 200 as shown in FIG. 12. In the subsequent discussion, the process steps shown in FIGS. 1A through 1I are discussed referring to the process steps in FIG. 12.

Referring to FIG. 1A, device die 10 (which is a part of the respective wafer 2 that has a plurality of device dies) is provided. In accordance with some embodiments of the present disclosure, device die 10 is a logic die, which may be a Central Processing Unit (CPU) die, a Micro Control Unit (MCU) die, an input-output (IO) die, a BaseBand (BB) die, or an Application processor (AP) die. Although not shown, device die 10 may include a semiconductor substrate, wherein active devices such as transistors and/or diodes are formed at a top surface of the semiconductor substrate. Furthermore, metal lines and vias (not shown) are formed in an interconnect structure (not shown), which is over the semiconductor substrate, of device die 10 to interconnect the integrated circuit devices in device die 10.

Metal pads 12 are formed at the top surface 10A of device die 10. The top surface 10A of device die 10 is also referred to as a front surface. device die 10 has back surface 10B, which may also be the back surface of the respective semiconductor substrate in device die 10. Metal pads 12 may be aluminum pads, copper pads, aluminum copper pads, or the like. Metal pads 12 may be formed in a first surface region of device die 10, and a second surface region of device die 10 has no metal pads formed therein. For example, in accordance with some exemplary embodiments as shown in FIG. 1A, the right surface region have metal pads 12 therein, and the left surface region have no metal pads.

Figure 1B:
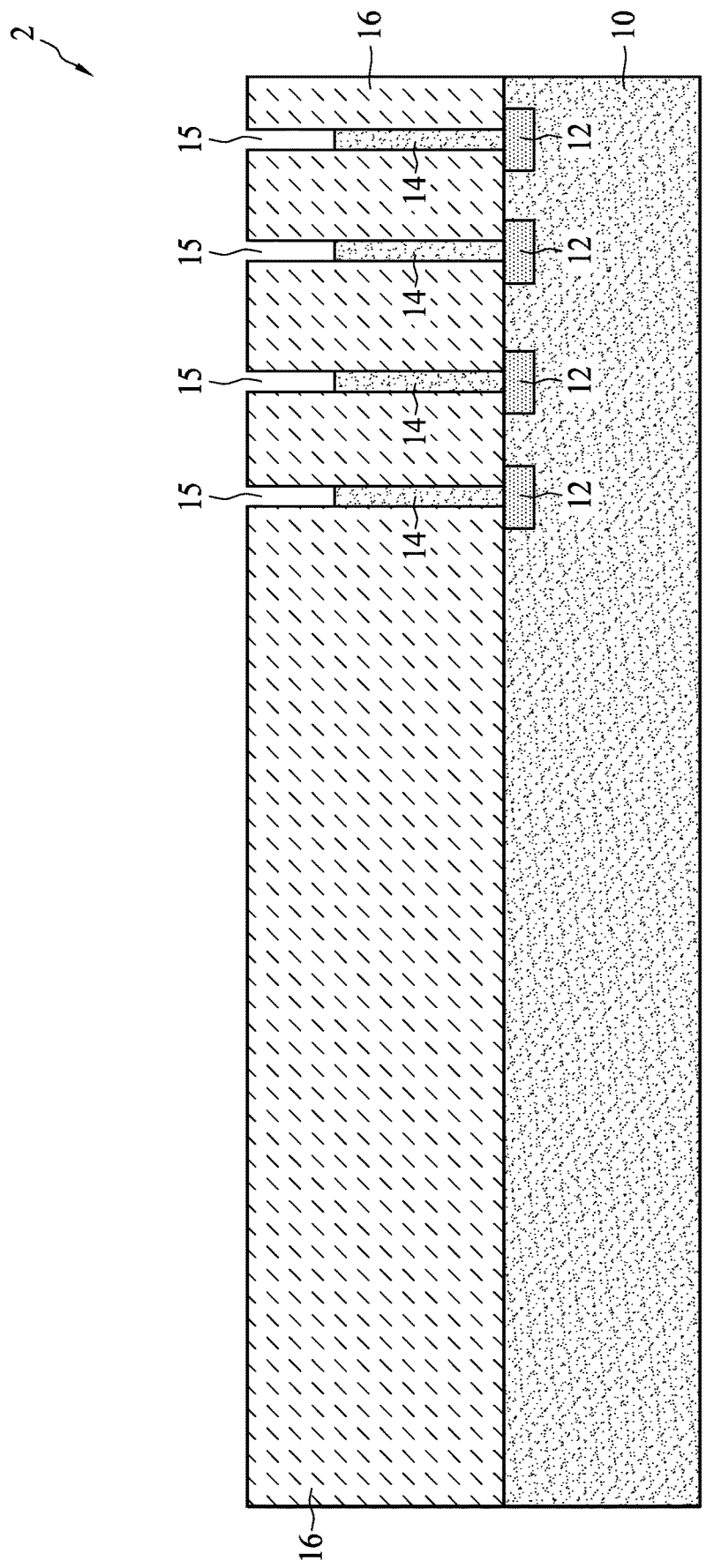
Figure 1C:
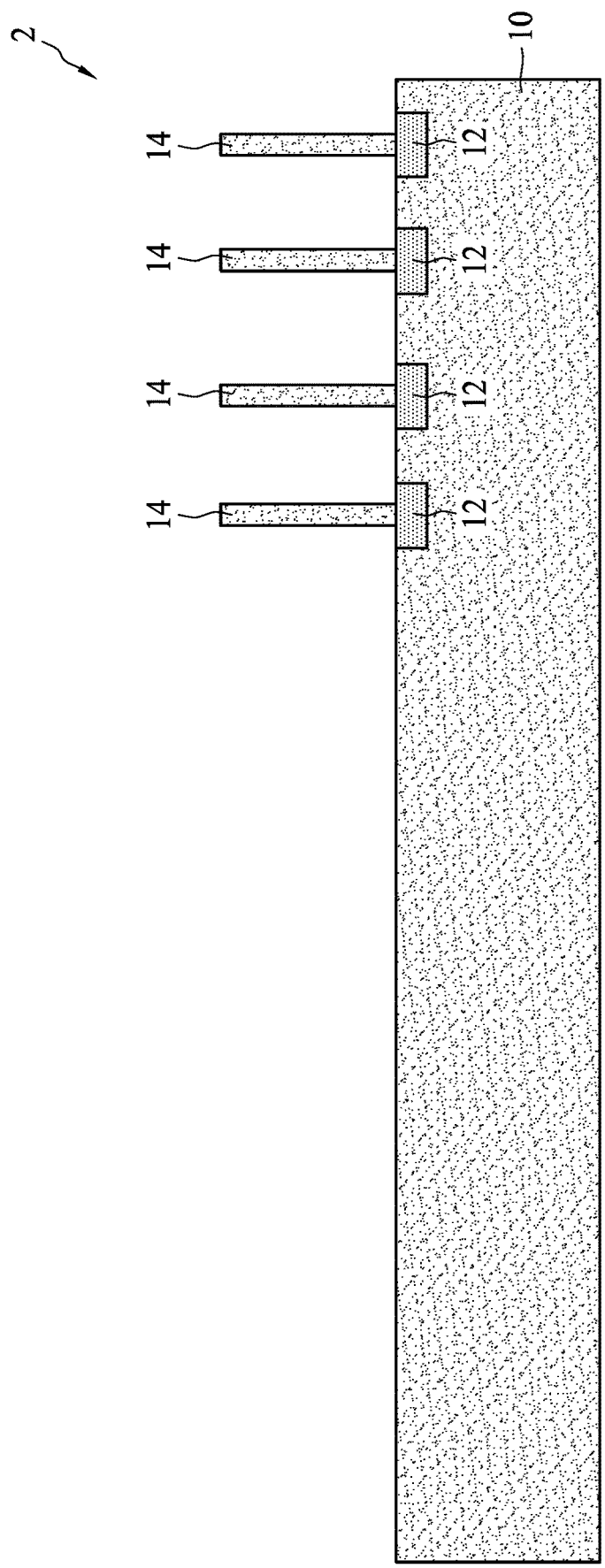

FIGS. 1B and 1C illustrate the formation of through-vias 14. The respective step is illustrated as step 202 in the process step shown in FIG. 12. In accordance with some embodiments, as shown in FIG. 1B, photo resist 16 is formed over wafer 2, and is then patterned to form openings 15, through which a portion of each of metal pads 12 is exposed. Through-vias 14 are then plated in openings 15. Photo resist 16 is then removed, resulting in the structure in FIG. 1C. In accordance with some embodiments of the present disclosure, no seed layer is formed on wafer 2 before the plating. In accordance with alternative embodiments, a seed layer (not shown) is formed before photo resist 16 is formed, and through-vias 14 are plated on the seed layer. After the removal of photo resist 16, the portions of the seed layer not directly underlying through-vias 14 are removed in an etching process. The remaining portions of the seed layer thus become the bottom portions of through-vias 14.

Figure 1D:
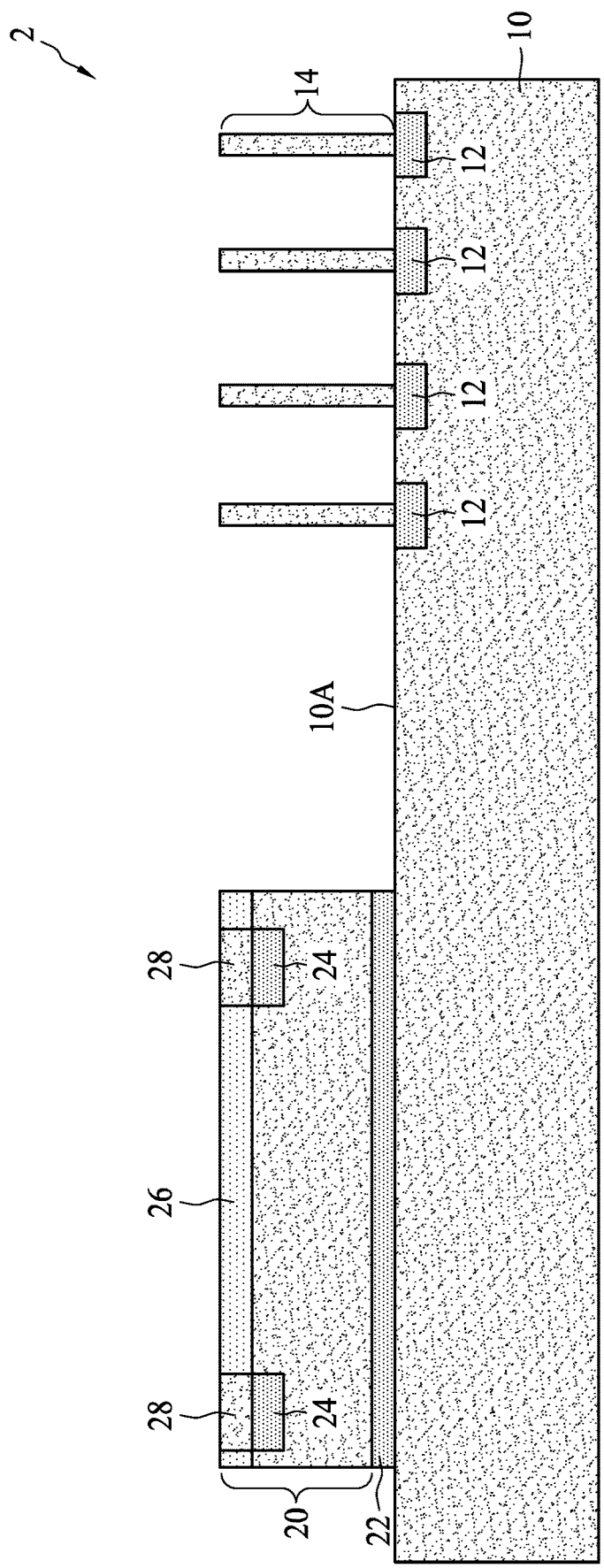

Next, referring to FIG. 1D, device die 20 is adhered to device die 10 through Die-Attach Film (DAF) 22. The respective step is illustrated as step 204 in the process step shown in FIG. 12. The back surface of device die 20 is adhered to the front surface 10A of device die 10, and hence the corresponding die stacking is a face-to-back stacking. In accordance with some embodiments of the present disclosure, device die 20 is a memory die, which may be a Negative-AND (NAND) die, a static Random Access Memory (SRAM) die, a low IO Double-Data-Rate (DDR) die, or the like. Although not shown, device die 20 may be a single memory die or a stacked memory dies. Also device die 20 may also include a semiconductor substrate, wherein active devices such as transistors and/or diodes are formed at a top surface of the semiconductor substrate. Furthermore, metal lines and vias (not shown) are formed in the interconnect structure of device die 20 to interconnect the integrated circuit devices in device die 20. The back surface of device die 20 may also be the back surface of the semiconductor substrate in device die 20.

Figure 11:
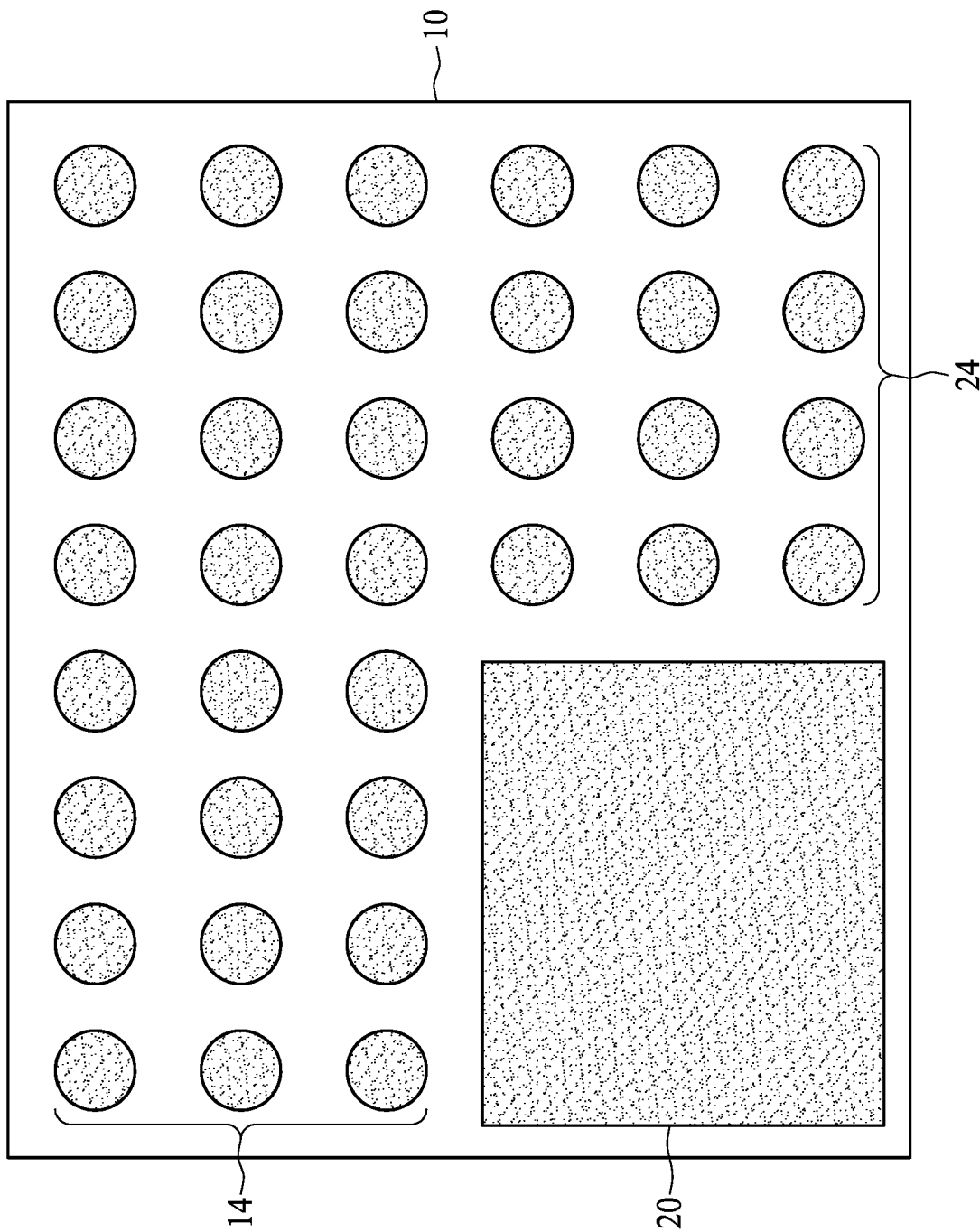
FIG. 11 illustrates a top view of a fan-out package in accordance with some embodiments.

FIG. 11 illustrates an exemplary top view of device die 10 and the corresponding overlying device die 20 and through-vias 14. In accordance with some exemplary embodiments, device die 20 overlaps a corner region of device die 10, with through-vias 14 being adjacent to two sidewalls of device die 20. In accordance with alternative embodiments, device die 20 overlaps a center region of device die 10, and through-vias 14 encircle device die 20. Device die 20 and through-vias 14 may also be laid out using other layout schemes.

DAF 22 is an adhesive film, and may be formed of a polymer. In accordance with some embodiments of the present disclosure, DAF 22 has a low thermal conductivity, which may be lower than about 0.5 W/m*K.

Referring back to FIG. 1D, device die 20 includes conductive pillars 28, which may be metal pillars, formed in surface dielectric layer 26. Metal pillars 28 may be formed of copper, nickel, palladium, gold, multi-layers thereof, and/or alloys thereof. Surface dielectric layer 26 may be formed of polybenzoxazole (PBO), polyimide, benzocyclobutene (BCB), or the like. Underlying metal pillars 28 may reside metal pads 24, which may be formed of copper, aluminum, or other metals.

Figure 1E:
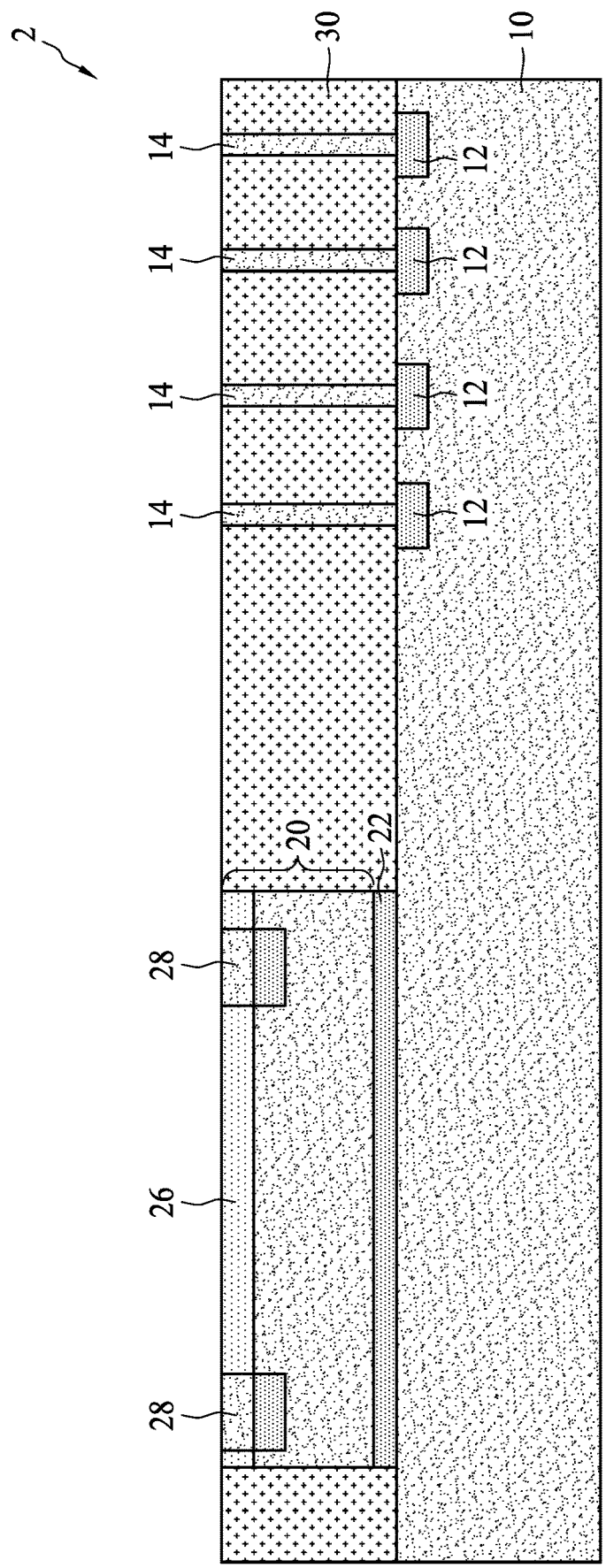

Referring to FIG. 1E, encapsulating material 30 is encapsulated on device die 20 and through-vias 14. The respective step is illustrated as step 206 in the process step shown in FIG. 12. Encapsulating material 30 is dispensed as a fluid and then being compressed and cured, for example, in a thermal curing process. Encapsulating material 30 fills the gaps between device die 20 and through-vias 14. Encapsulating material 30 may include a molding compound, a molding underfill, an epoxy, or a resin. After the encapsulating process, the top surface of encapsulating material 30 is higher than the top ends of metal pillars 28 and through-vias 14.

Next, a planarization step such as a mechanical grinding, a Chemical Mechanical Polish (CMP) and/or a combination of both is performed to planarize encapsulating material 30, through-vias 14, surface dielectric layer 26, and metal pillars 28. The respective step is also illustrated as step 206 in the process step shown in FIG. 12. The resulting structure is also shown in FIG. 1E. Due to the planarization, the top surfaces of through-vias 14 are level (coplanar) with the top surfaces of metal pillars 28, and are level (coplanar) with the top surface of encapsulating material 30.

Figure 1F:
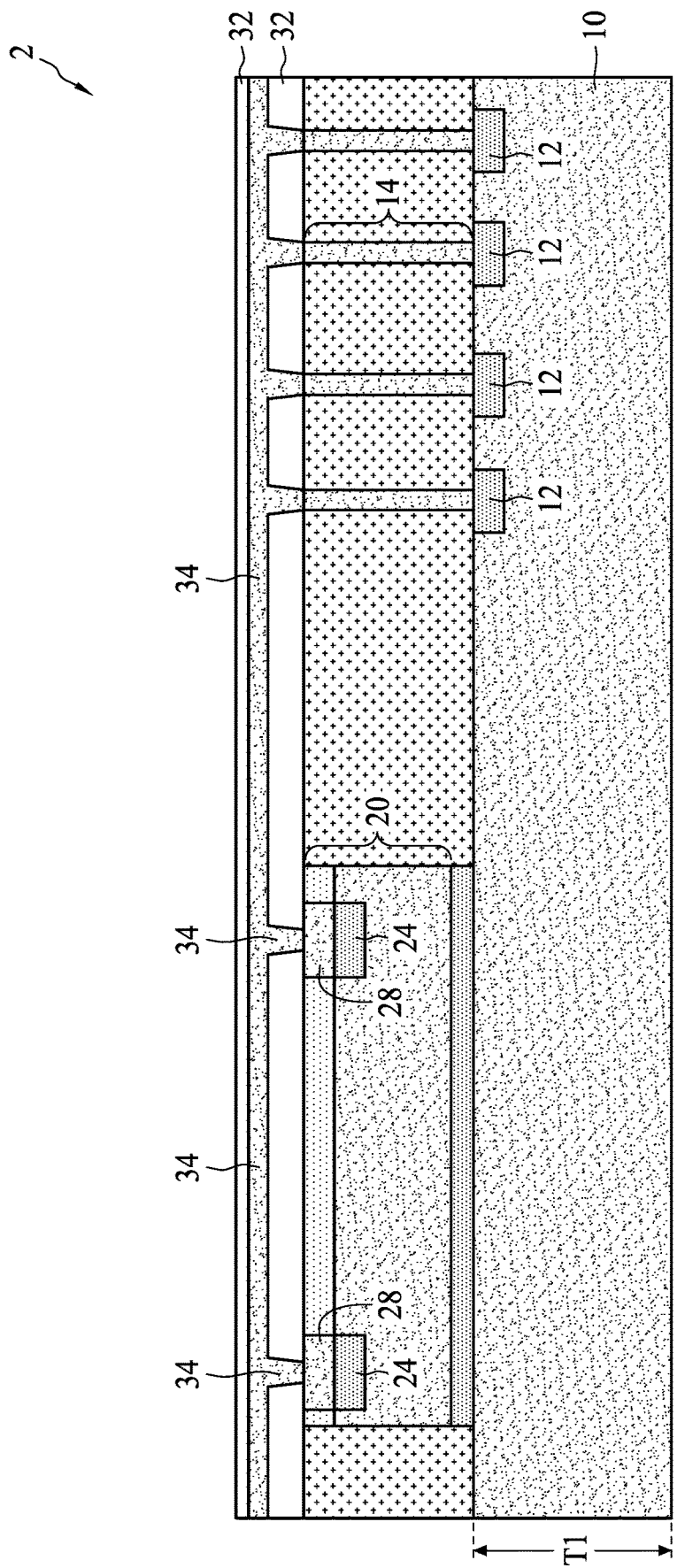

Referring to FIG. 1F, one or more dielectric layer 32 and the respective Redistribution Layers (RDLs) 34 are formed over encapsulating material 30, through-vias 14, and metal pillars 28. The respective step is illustrated as step 208 in the process step shown in FIG. 12. In accordance with some embodiments of the present disclosure, dielectric layers 32 are formed of a polymer(s) such as PBO, polyimide, BCB, or the like.

RDLs 34 are formed to electrically couple to metal pillars 28 and through-vias 14. It is noted that the illustration of RDLs 34 throughout all figures is schematic. For example, RDLs 34 are actually patterned as a plurality of discrete portions separated from each other by the respective dielectric layer(s). Each of the discrete portions of RDLs 34 is connected to the respective underlying metal pillars 28 and/or through-vias 14. RDLs 34 may also interconnect some metal pillars 28 to the respective through-vias 14. RDLs 34 may include metal traces (metal lines) and vias underlying and connected to the metal traces. In accordance with some embodiments of the present disclosure, RDLs 34 are formed through plating processes, wherein each of RDLs 34 includes a seed layer (not shown) and a plated metallic material over the seed layer. The seed layer and the plated metallic material may be formed of the same material or different materials.

Figure 1G:
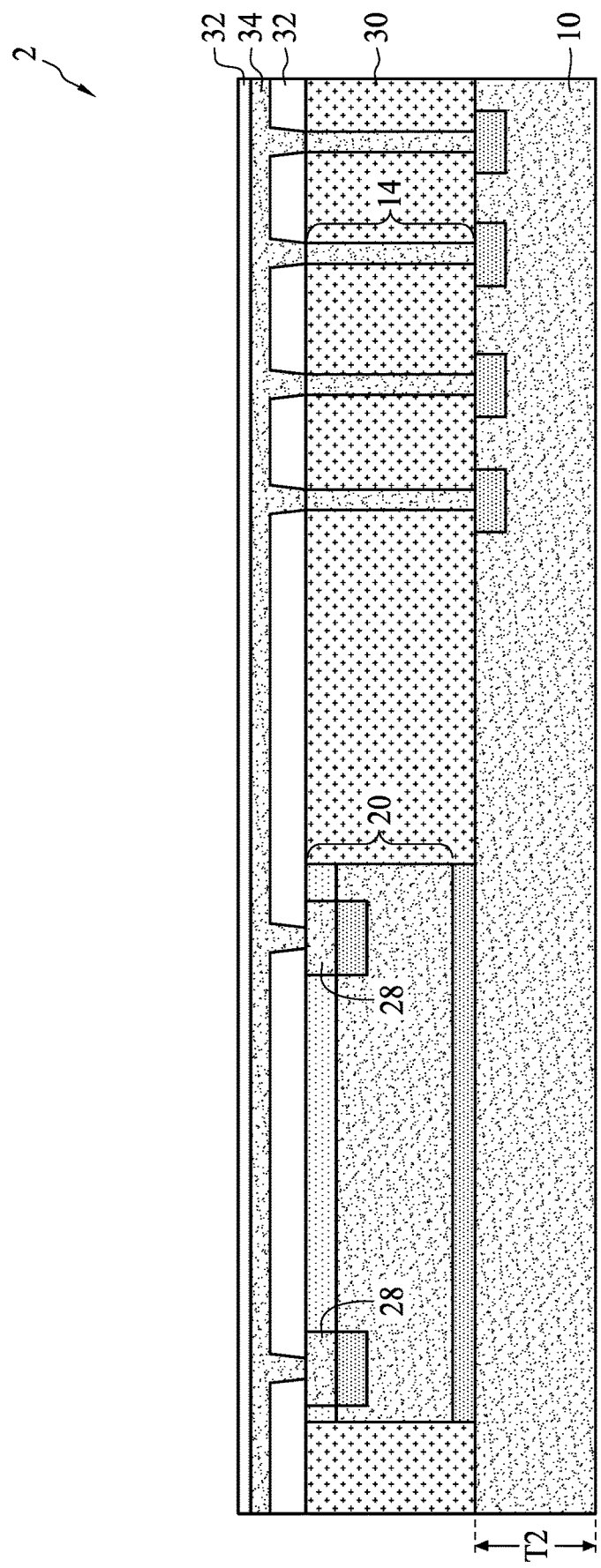

FIG. 1G illustrates the backside grinding of device die 10, which is grinded from its backside (the illustrated bottom side). The respective step is illustrated as step 210 in the process step shown in FIG. 12. Accordingly, the thickness of device die 10 is reduced from thickness T1 (FIG. 1F) to thickness T2 as shown in FIG. 1G.

Figure 1H:
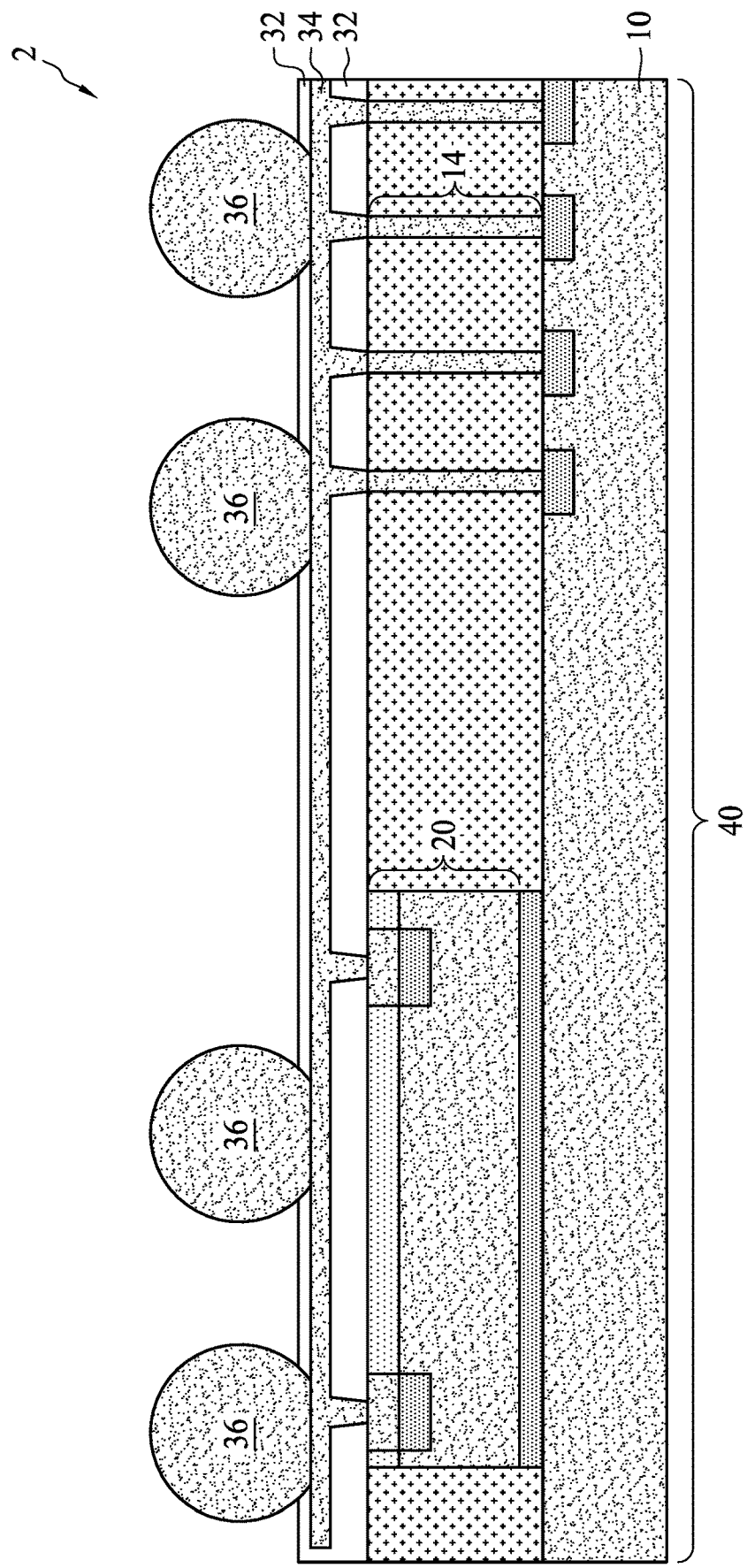

FIG. 1H illustrates the formation of electrical connectors 36 in accordance with some exemplary embodiments of the present disclosure. The respective step is illustrated as step 212 in the process step shown in FIG. 12. Electrical connectors 36 are electrically coupled to RDLs 34, metal pillars 28, and/or through-vias 14. The formation of electrical connectors 36 may include placing solder balls over RDLs 34 and then reflowing the solder balls. In accordance with alternative embodiments of the present disclosure, the formation of electrical connectors 36 includes performing a plating step to form solder regions over RDLs 34, and then reflowing the solder regions. Electrical connectors 36 may also include metal pillars, or metal pillars and solder caps, which may also be formed through plating.

In addition, Integrated Passive Device (IPD) 39 may be bonded to RDLs 34. IPD 39 may be used for tuning the performance of the resulting package, and may include a capacitor, for example. In accordance with alternative embodiments, no IPD 39 is bonded. Throughout the description, the combined structure including device dies 10 and 20, through-vias 14, encapsulating material 30, RDLs 34, and dielectric layers 32 will be referred to as composite wafer 38, which is a composite wafer including a plurality of device dies 10 and 20.

In subsequent steps, composite wafer 38 is sawed apart into a plurality of packages 40, each including one of device dies 10, one of device dies 20, and the corresponding through-vias 14. Package 40 in accordance with some embodiments is thus formed with a single encapsulating (molding) process, although package 40 includes two levels of device dies stacked together. This is different from conventional die stacking processes, wherein two levels of device dies are encapsulated using two encapsulating processes. In addition, no package substrate is used in package 40. This causes the advantageous reduction in the thickness of package 40, and hence package 40 is suitable for mobile applications that require very thin packages.

In accordance with some embodiments, while package 40 is a fan-out package since RDLs 34 extends beyond the edges of device die 20, the footprint (the top-view area) of package 40 is the same as the top-view area of device die 10, providing the top-view area of device die 10 is adequate for disposing all electrical connectors 36. Accordingly, the top-view area of package 40 is small. In addition, the distance between metal pads 12 and electrical connectors 36 is small, resulting in the improvement in the electrical performance of the resulting package 40.

Furthermore, device die 10, which may be a logic die, often generates more heat than memory device dies such as device die 20. Memory dies suffer from severe performance degradation from heat. In accordance with the embodiments of the present disclosure, DAF 22, which has low thermal conductivity, is used to reduce the heat generated in device die 10 from being conducted into device die 20. Rather, the heat in device die 10 may be conducted through through-vias 14 to electrical connectors 36. Some of through-vias 14 may also be designed as dummy vias that are not used for electrical connection between device die 10 and electrical connector 36. The dummy through-vias 14 may be electrically floating, and are used for conducting the heat in device die 10 to electrical connectors 36.

FIGS. 2A through 4J illustrate cross-sectional views of intermediate stages in the formation of a fan-out package in accordance with some embodiments of the present disclosure. Unless specified otherwise, the materials and the formation methods of the components in these embodiments are essentially the same as the like components, which are denoted by like reference numerals in the embodiments shown in FIGS. 1A through 1I. The details regarding the formation process and the materials of the components shown in FIGS. 2A through 4J (and the embodiments in FIGS. 5 through 10) may thus be found or realized through the discussion of the embodiments shown in FIGS. 1A through 1H.

Figure 2A:
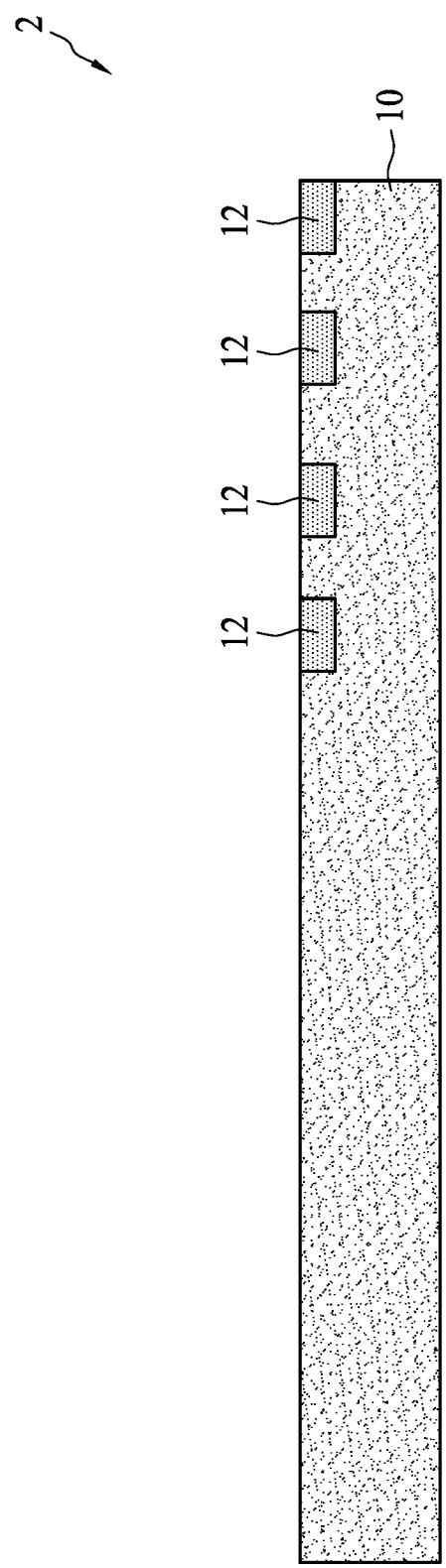
FIGS. 2A through 2I illustrate the cross-sectional views of intermediate stages in the formation of a fan-out package in accordance with some embodiments.
Figure 2B:
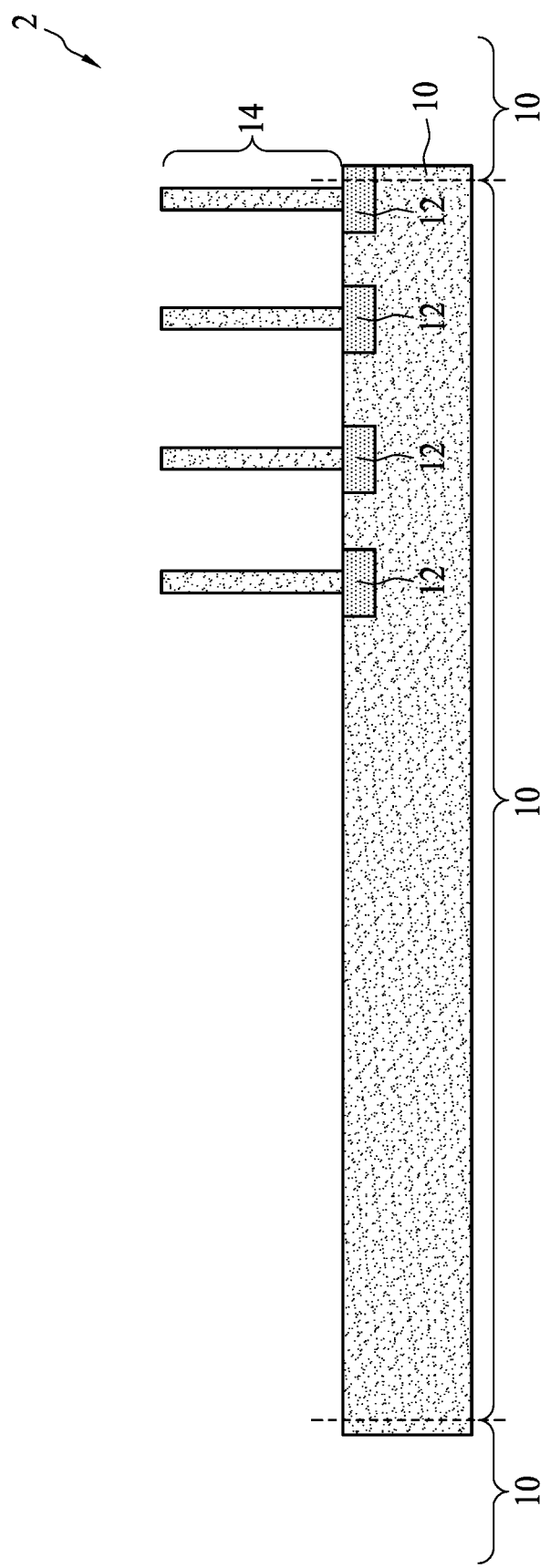

The initial steps of some embodiments are shown in FIGS. 2A and 2B, which are essentially the same as the process steps shown in FIGS. 1A through 1C. Through-vias 14 are formed on metal pads 12 of device dies 10. Next, wafer 2 is sawed into individual device dies 10.

Figure 2C:
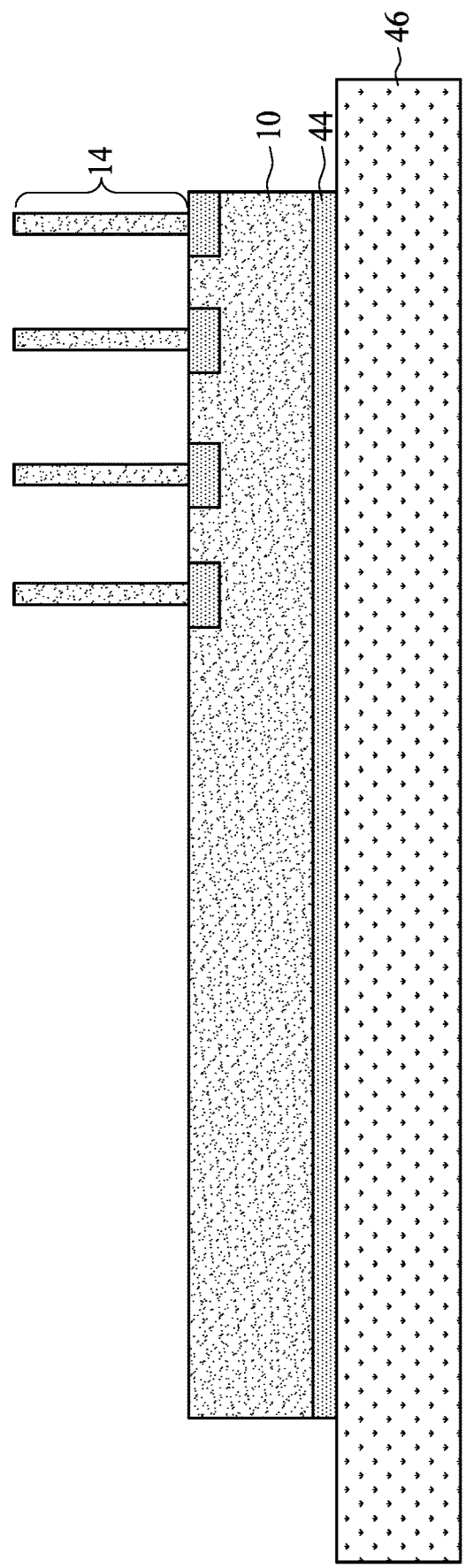
Figure 2D:
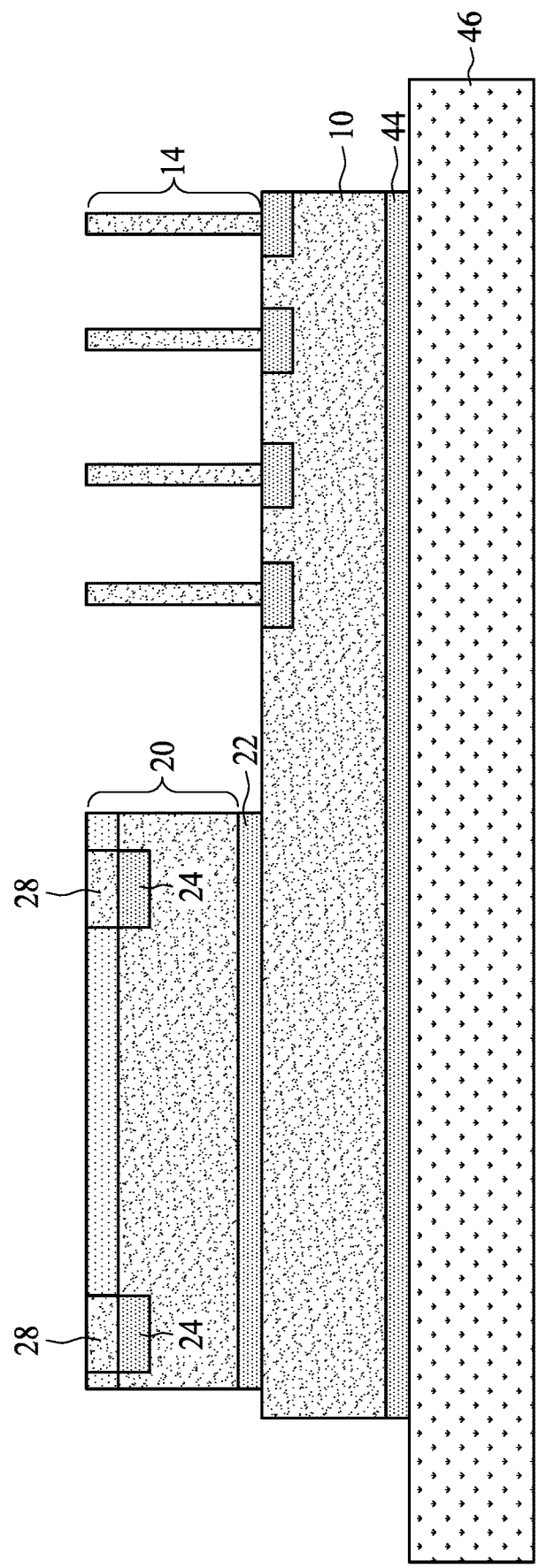
Figure 2E:
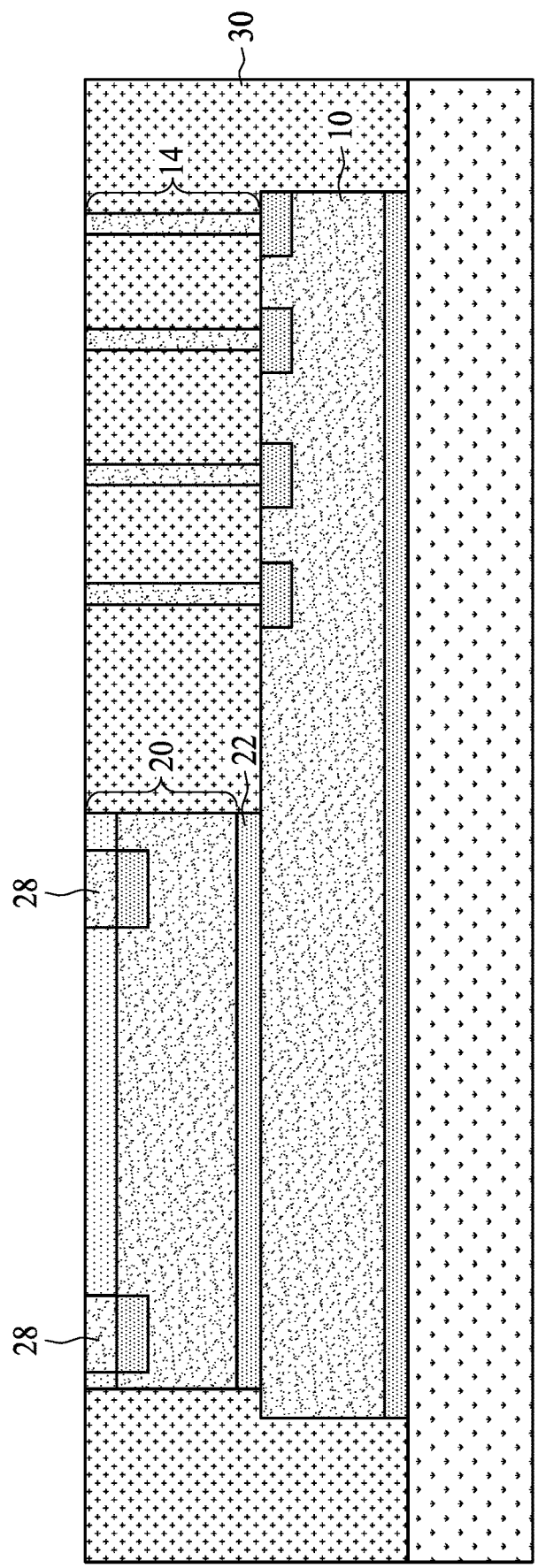

Referring to FIG. 2C, device die 10 is adhered to carrier 46 through adhesive film 44. In accordance with some embodiments of the present disclosure, carrier 46 is a glass carrier. Although one device die 10 is shown, there is a plurality of device dies 10 placed on carrier 46, and device dies 10 may be laid out as an array. Device die 20 is then adhered to the front surface of device die 10 through DAF 22, as shown in FIG. 2D. In a subsequent step, as shown in FIG. 2E, encapsulating material 30 is dispensed to encapsulate device dies 10 and 20. Different from the embodiments as shown in FIG. 1E, device die 10 is also encapsulated. Since the encapsulation of device dies 10 and 20 is achieved in a single encapsulating process, there is no distinguishable interface between the upper part (for encapsulating device die 20) and the bottom part (for encapsulating device die 10) of encapsulating material 30.

Figure 2F:
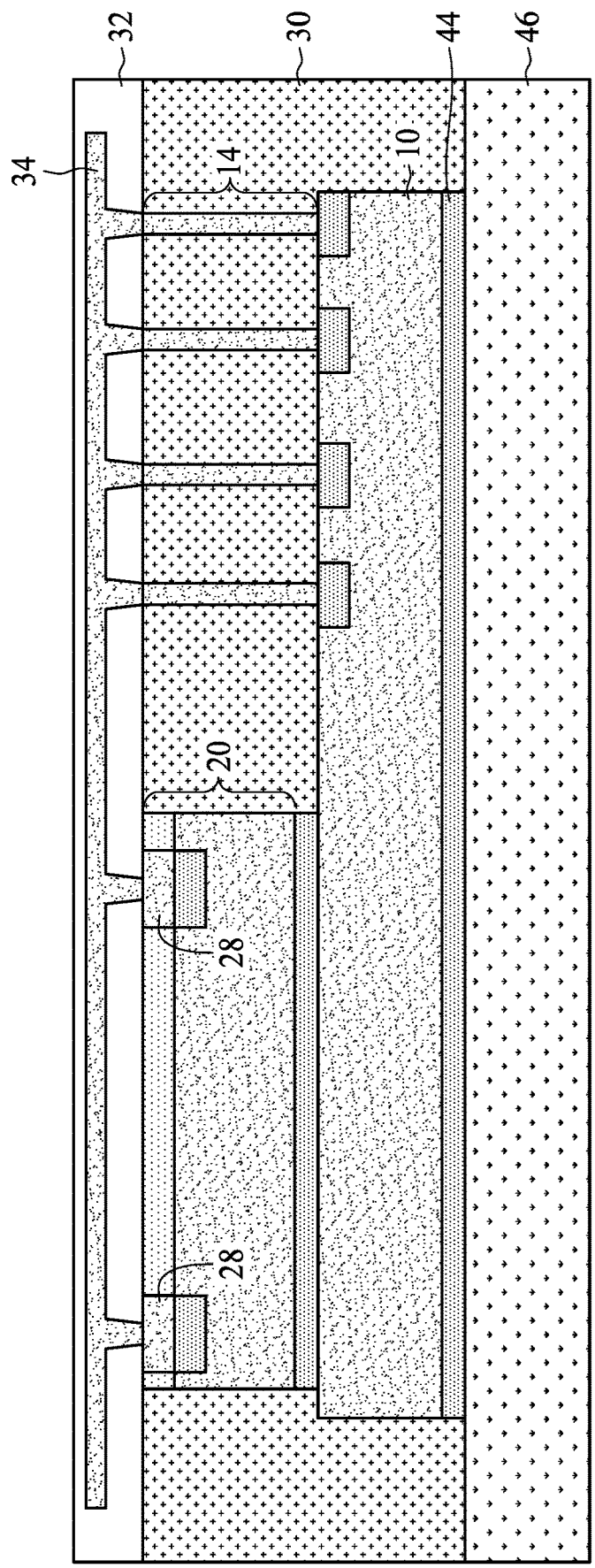

In a subsequent step, as shown in FIG. 2F, dielectric layers 32 and RDLs 34 are formed over encapsulating material 30, with RDLs 34 electrically coupled to metal pillars 28 and through-vias 14. In accordance with some exemplary embodiments, RDLs 34 expand beyond the edges of both device dies 10 and 20. Accordingly, the embodiments shown in FIG. 2F (compared to FIG. 1F) may be used in the embodiments in which the top-view area of device die 10 is not large enough to accommodate all of electrical connectors 36 (FIG. 2I), and hence RDLs 34 need to fan-out from device die 10.

Figure 2G:
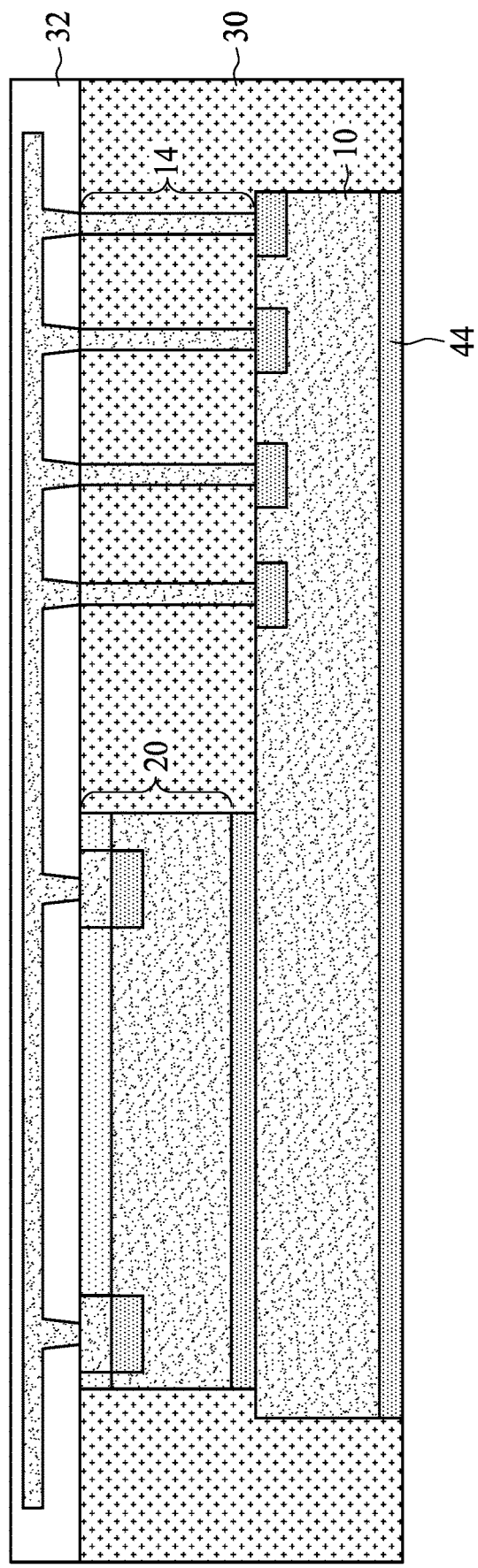
Figure 2H:
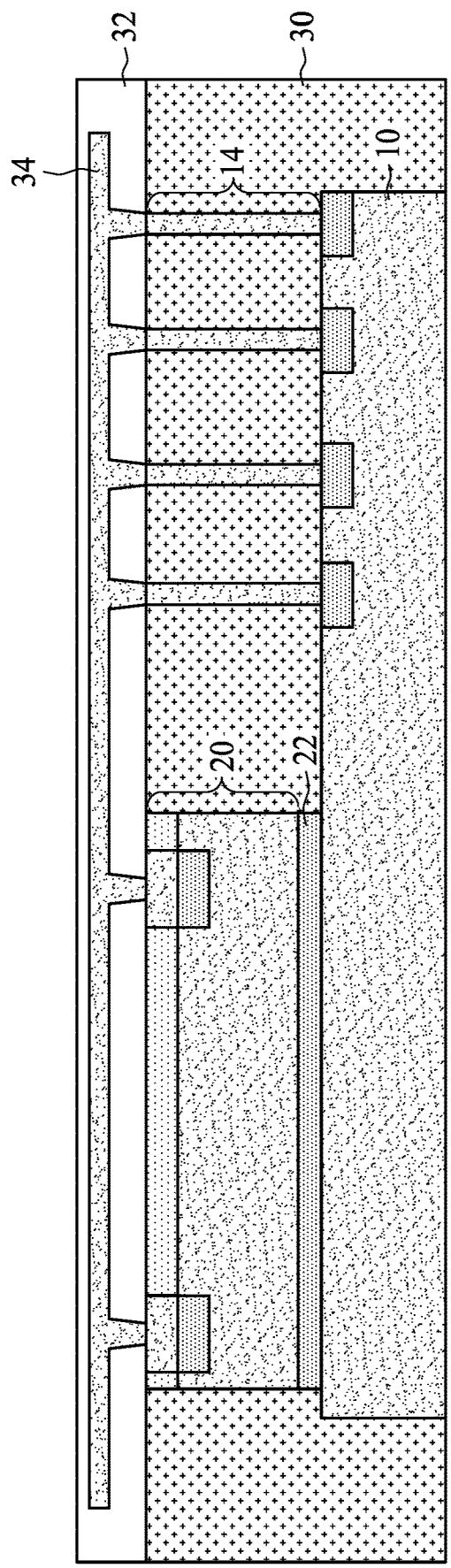
Figure 2I:
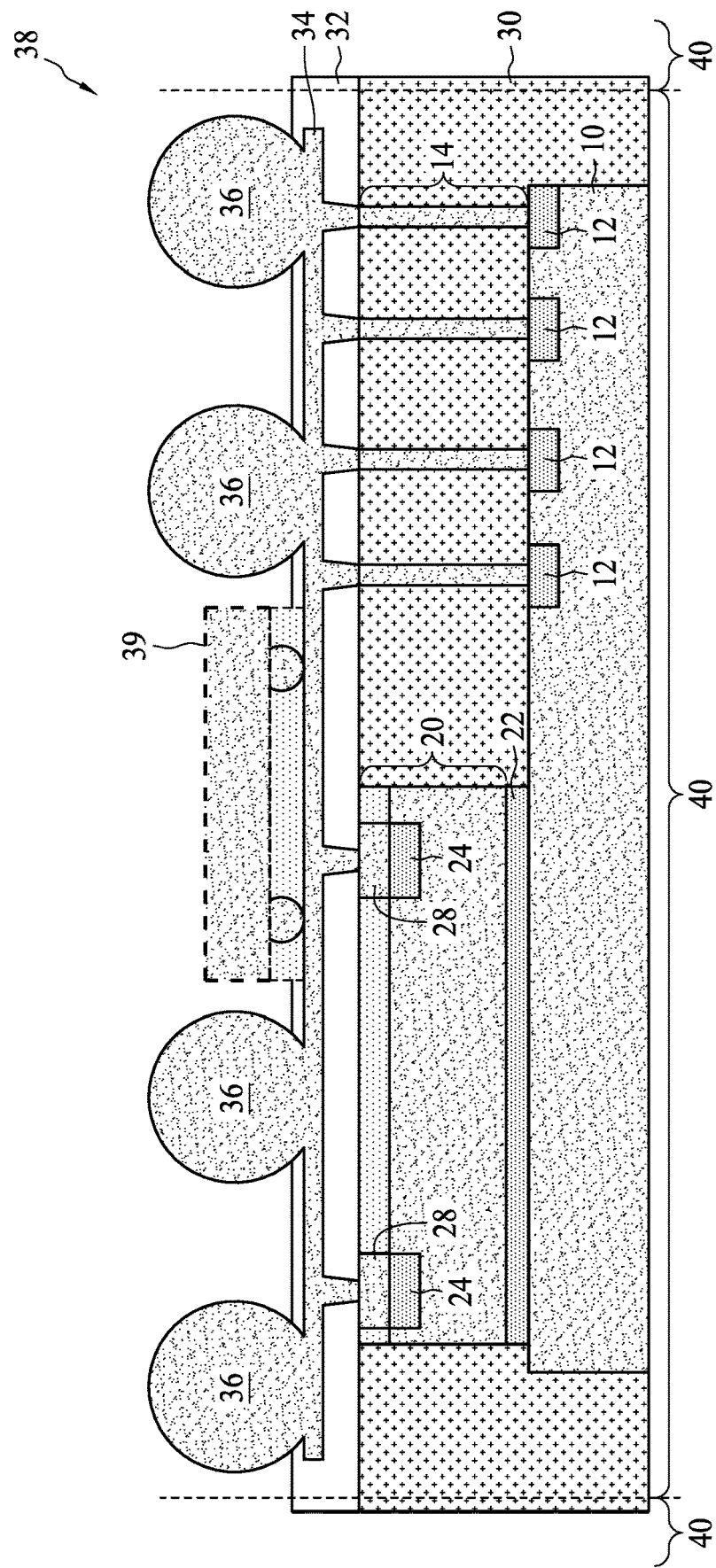

Next, carrier 46 is de-bonded from the overlying structure, resulting in the structure shown in FIG. 2G. A backside grinding may then be performed to remove adhesive film 44 and to thin device die 10, and the resulting structure is shown in FIG. 2H. In FIG. 2I, IPD 39 may be (or may not be) bonded to RDLs 34. The resulting composite wafer 38, which includes device dies 10, device dies 20, encapsulating material 30, through-vias 14, RDLs 34, and dielectric layers 32, is sawed into individual packages 40.

Figure 3A:
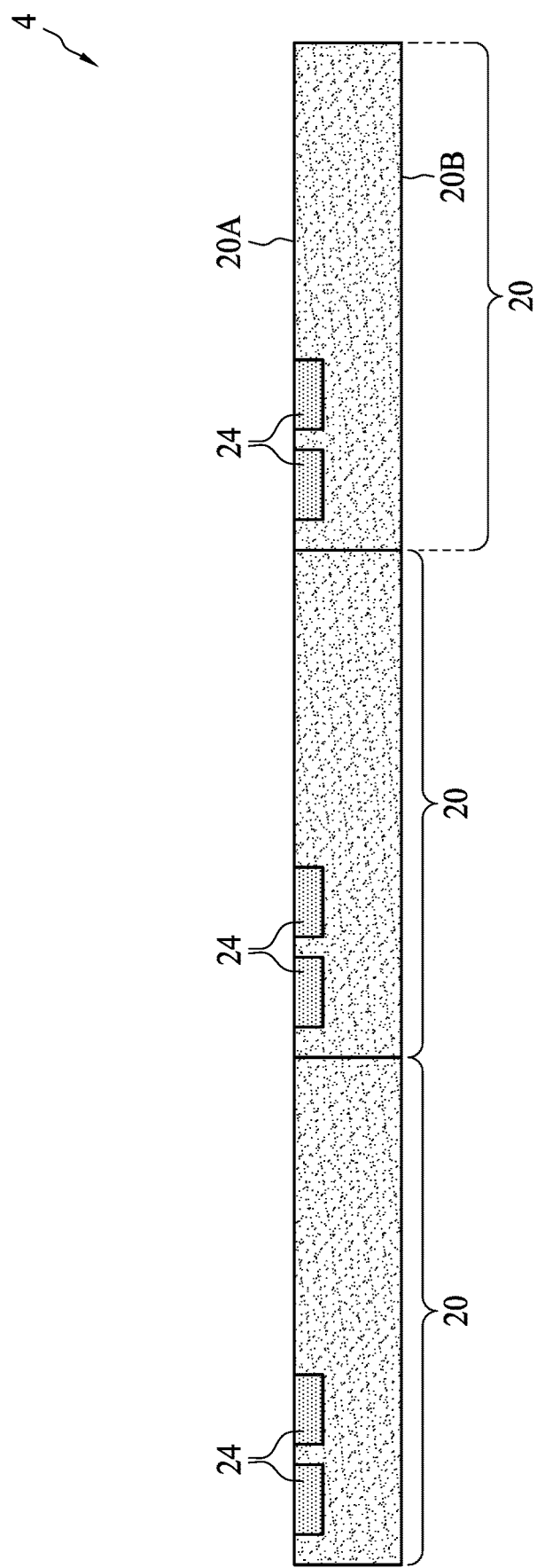
FIGS. 3A through 3J illustrate the cross-sectional views of intermediate stages in the formation of a fan-out package in accordance with some embodiments.

FIGS. 3A through 3J illustrate the formation of fan-out packages 40 in accordance with some embodiments. Referring to FIGS. 3A, wafer 4 is formed, which includes device dies 20 therein. Conductive pads (such as metal pads) 24 are formed at the front surface 20A of device dies 20. Device die 20 has back surface 20B, which may also be the back surface of the respective semiconductor substrate (not shown) therein. Next, referring to FIG. 3B, through-vias 14 are formed, wherein the formation process may be similar to the process shown in FIGS. 1B and 1C. Wafer 4 is then sawed part into individual device dies 20.

Figure 3B:
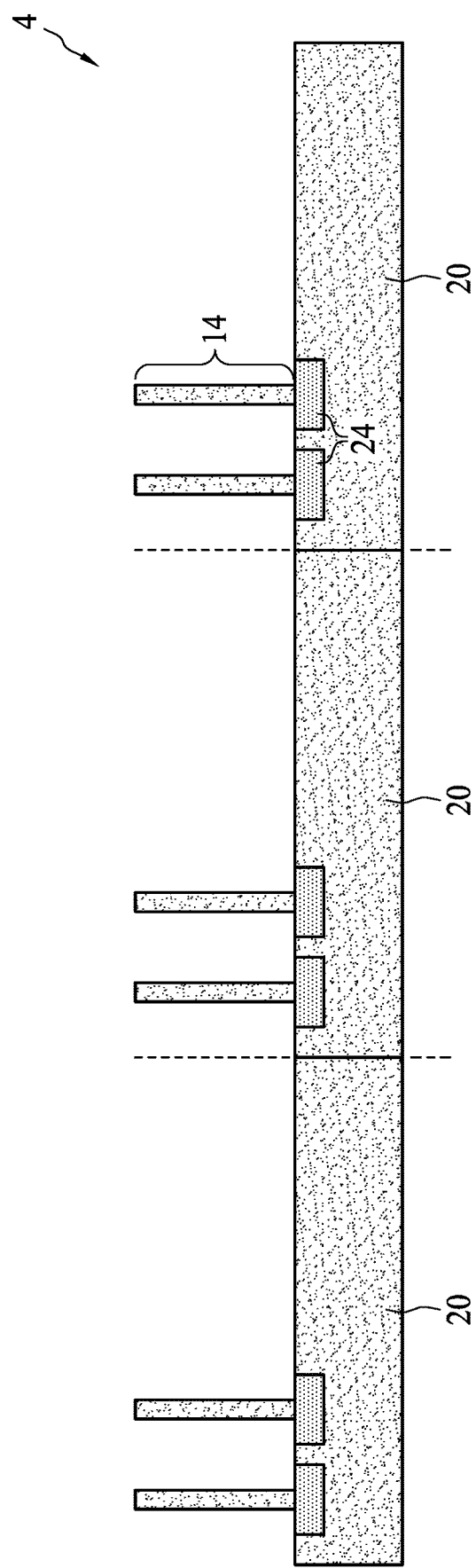
Figure 3C:
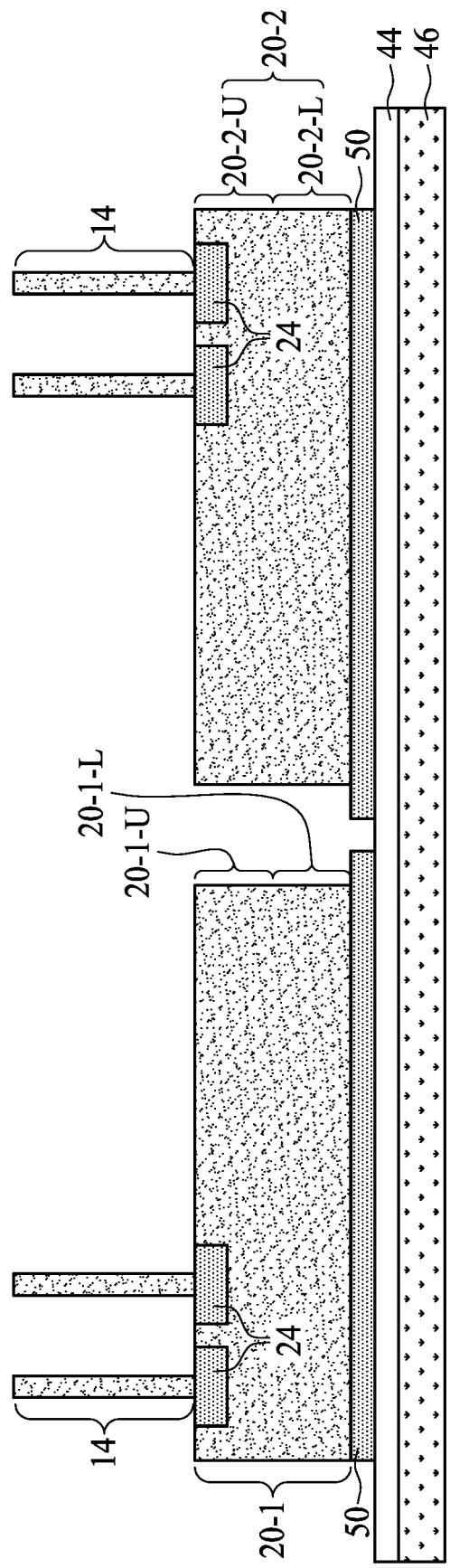
Figure 3D:
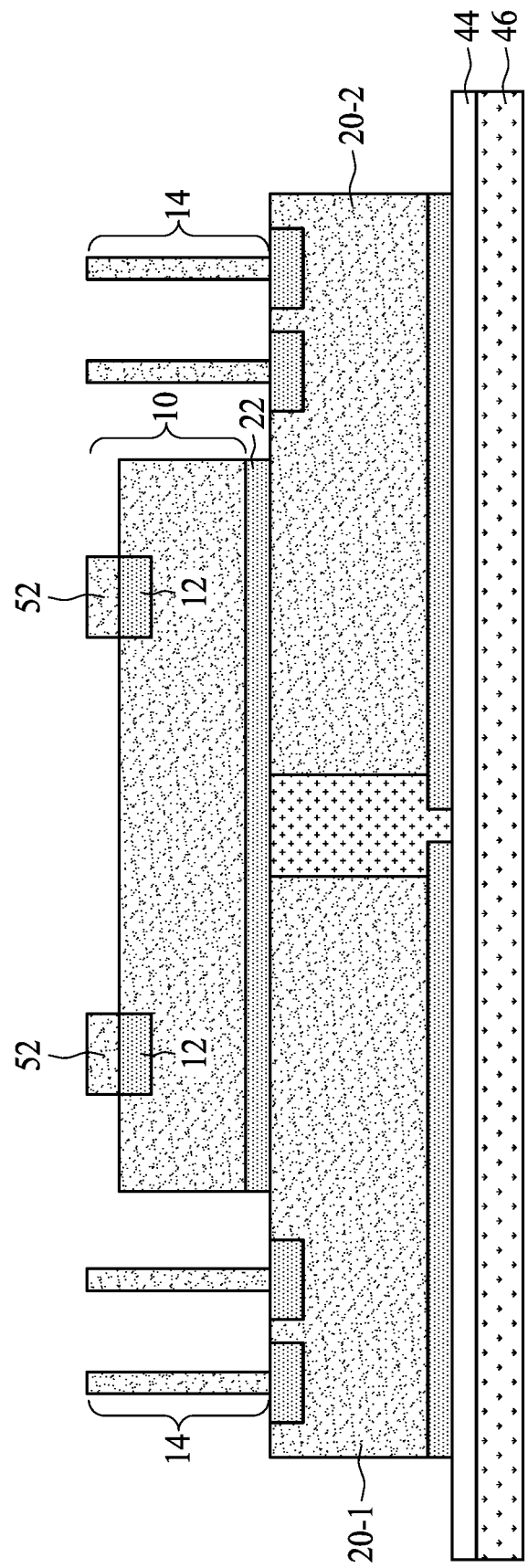

Referring to FIG. 3C, device dies 20 (including 20-1 and 20-2) are picked and placed on carrier 46 and the overlying adhesive film 44. Adhesive layer 44 may be formed of a Light-to-Heat Conversion (LTHC) material. In addition, DAFs 50 may be used to adhere device dies 20 to adhesive film 44. The distance between device dies 20-1 and 20-2 is selected, so that the space between the through-vias 14 over device die 20-1 and the through-vias 14 over device die 20-2 is big enough to accommodate device die 10 (FIG. 3D). In accordance with some embodiments of the present disclosure, device dies 20-1 and 20-2 are identical to each other, and device die 20-1 is rotated by 180 degrees (in a top view) relative to device die 20-2. In accordance with alternative embodiments, device dies 20-1 and 20-2 are partially identical to each other, wherein the lower part (of device die 20-1) 20-1-L such as the active devices and the interconnect structure (not shown) is identical to the lower part 20-2-L of device die 20-2. The upper parts 20-1-U and 20-2-U, which include the top redistribution layer(s) (not shown), however, are different from each other, so that the conductive pads 24 in device die 20-1 are concentrated on the left side of device die 20-1, and the conductive pads 24 in device die 20-2 are concentrated on the right side of device die 20-2. In accordance with alternative embodiments of the present disclosure, device dies 20-1 and 20-2 are different types of dies, and have different structures. In accordance with alternative embodiments of the present disclosure, device dies 20 may include more than two dies, such as four dies, and device die 10 may include more than one die, such as two dies, for the integration of multiple logics and multiple memory chips depending on design needs.

Next, referring to FIG. 3D, device die 10 is placed over device dies 20, and is adhered to the front surfaces of device dies 20 through DAF 22. A portion of device die 10 also overlaps the gap between device dies 20. In accordance with some embodiments, device die 10 includes metal pillars 52 over metal pads 12, with no dielectric layer encircling metal pillars 52. In accordance with alternative embodiments, there is a dielectric layer (not shown) at the same level as, and encircling metal pillars 52. In accordance yet alternative embodiments, no metal pillars are formed over metal pads 12, and metal pads 12 are the top conductive features of device die 10.

Figure 3E:
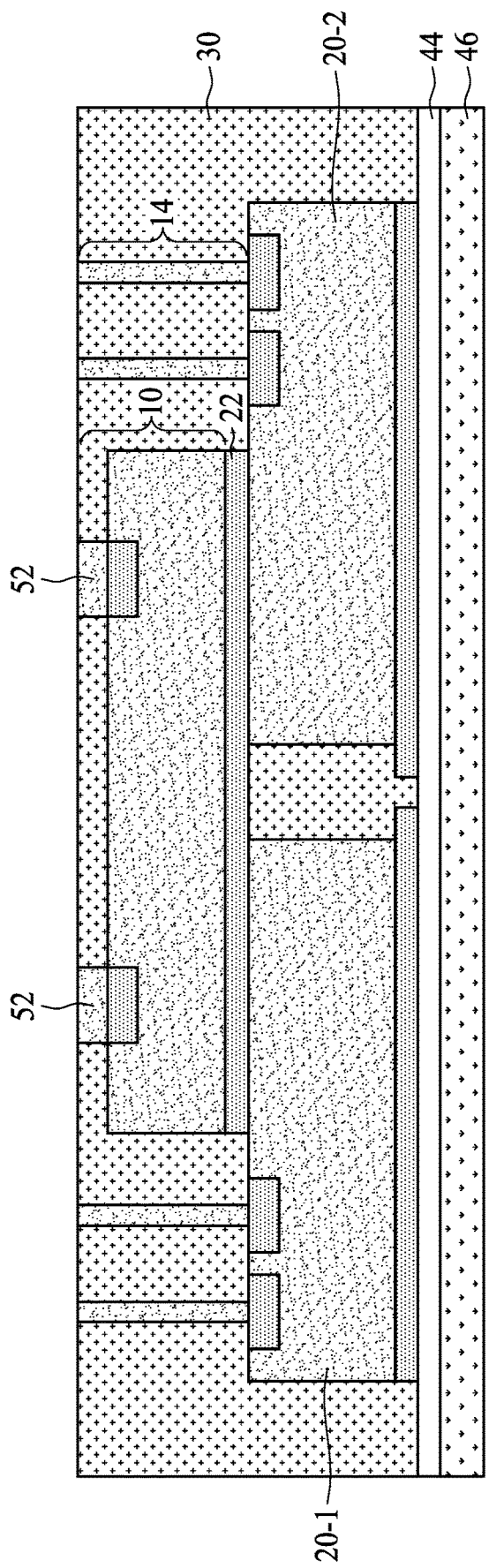
Figure 3F:
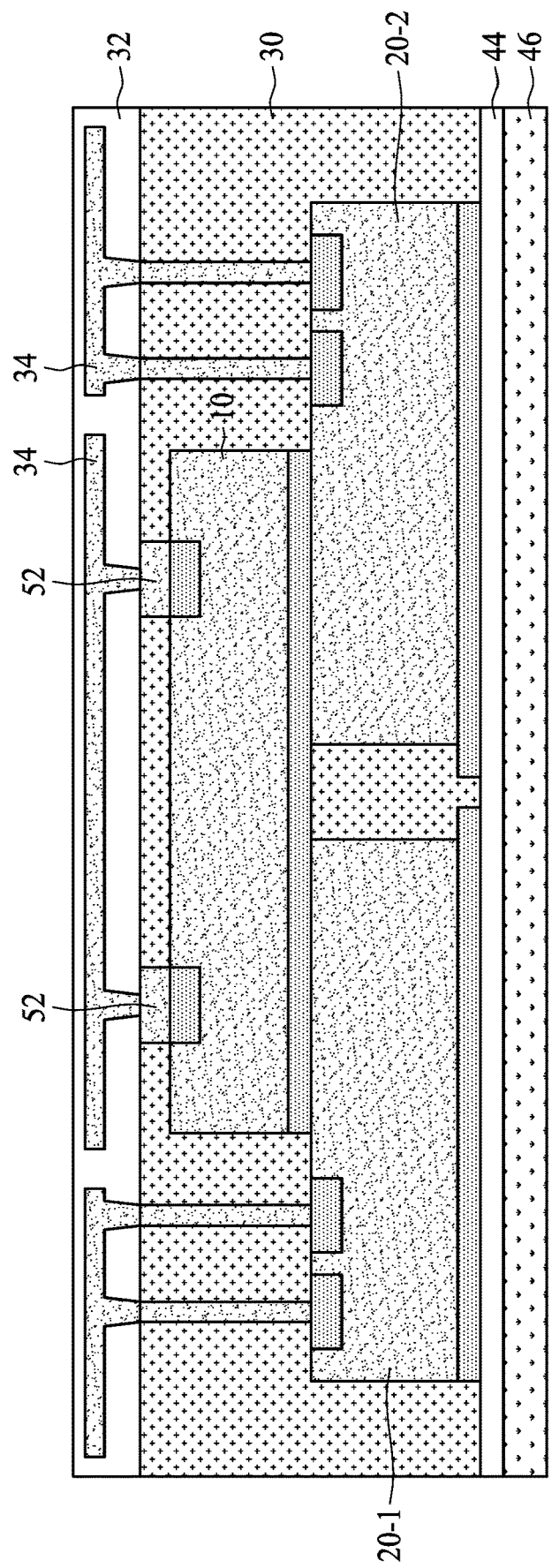
Figure 3G:
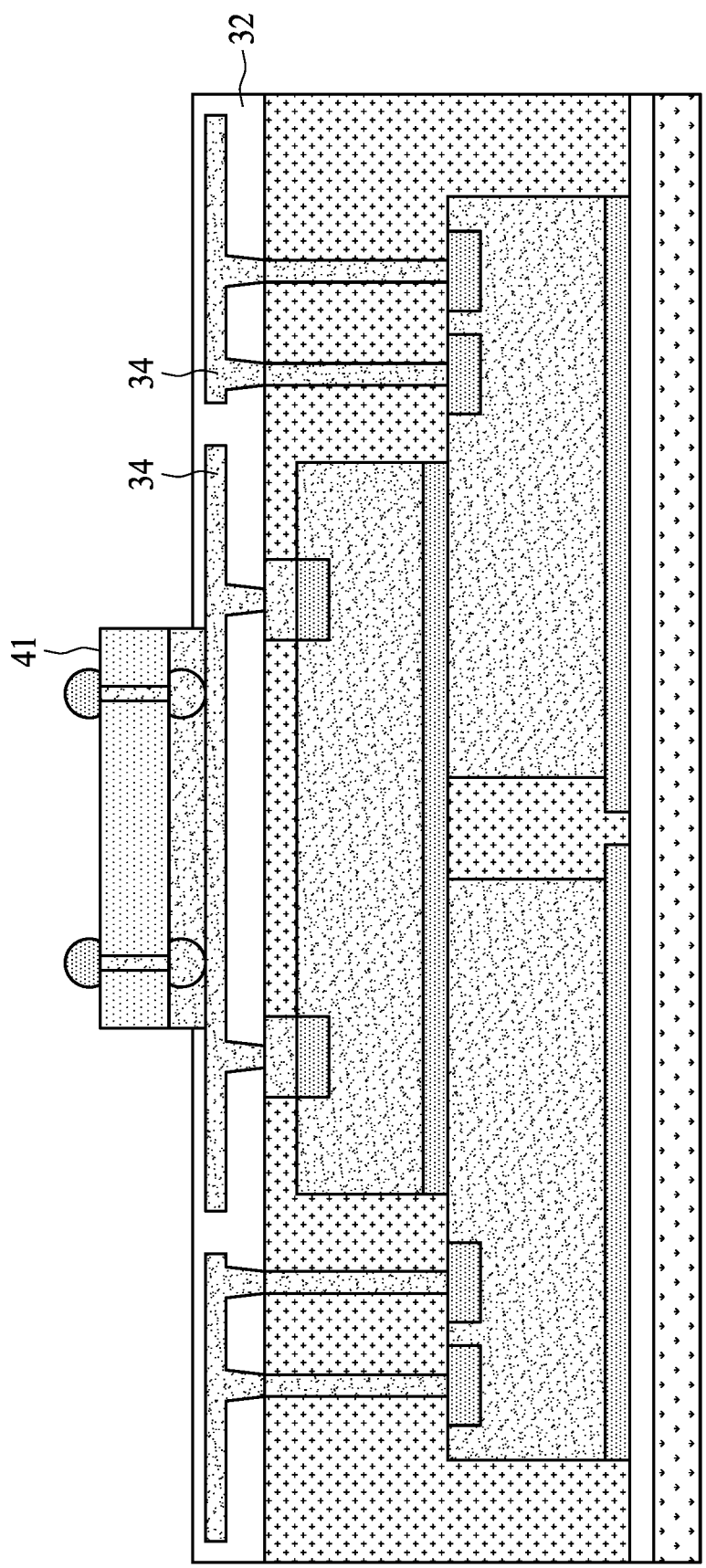
Figure 3H:
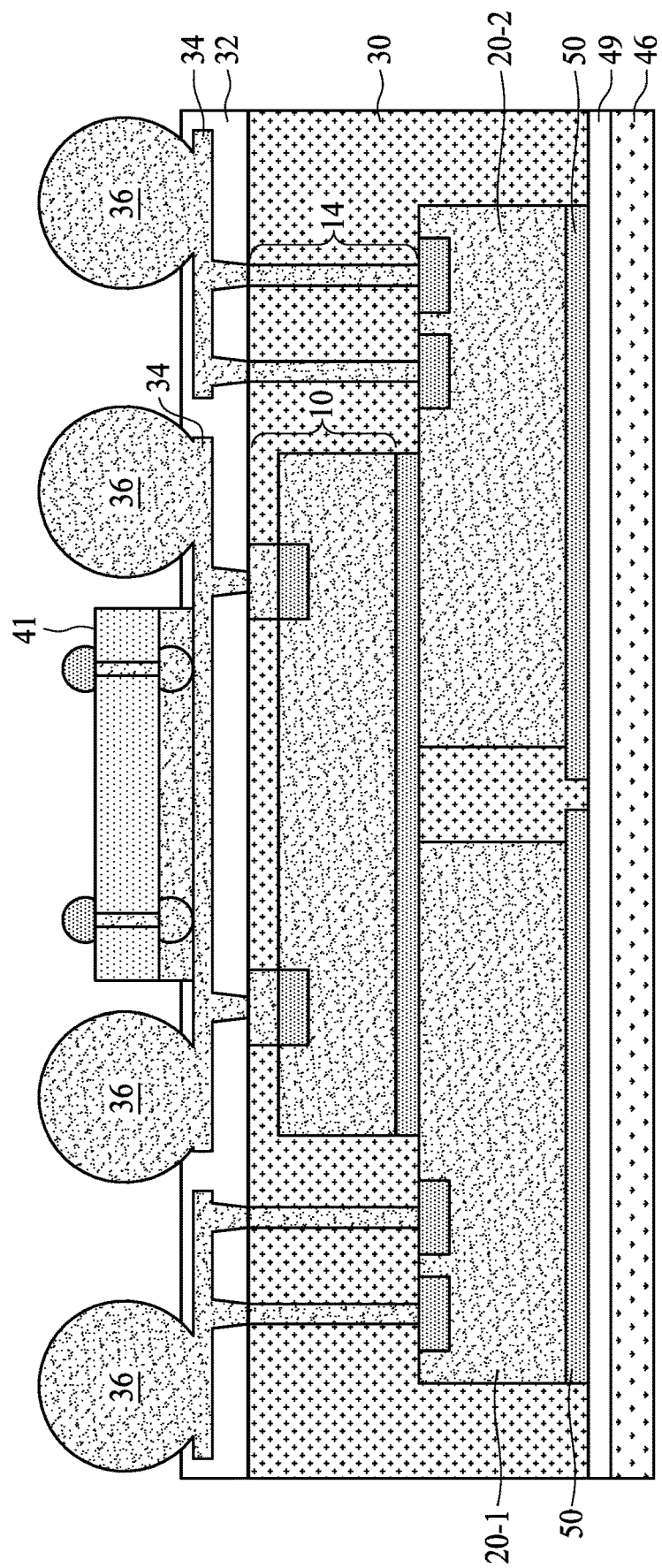

FIG. 3E illustrates the encapsulation of device dies 10 and 20 and through-vias 14 in encapsulating material 30, followed by a mechanical grinding, a Chemical Mechanical Polish (CMP) and/or a combination of both to expose metal pillars 52 and through-vias 14. In subsequent steps, dielectric layers 32 and RDLs 34 are formed, and RDLs 34 are electrically coupled to metal pillars 52 and through-vias 14, as shown in FIG. 3F. Next, device die 41 may be bonded to RDLs 34 (FIG. 3G), and electrical connectors 36 are formed to connect to RDLs 34 (FIG. 3H). Device die 41 may include through-vias (sometimes referred to as through-silicon vias or through-substrate vias) penetrating through the semiconductor substrate in device die 41. An IPD may also be bonded to RDLs 34 in accordance with some embodiments.

Figure 1I:
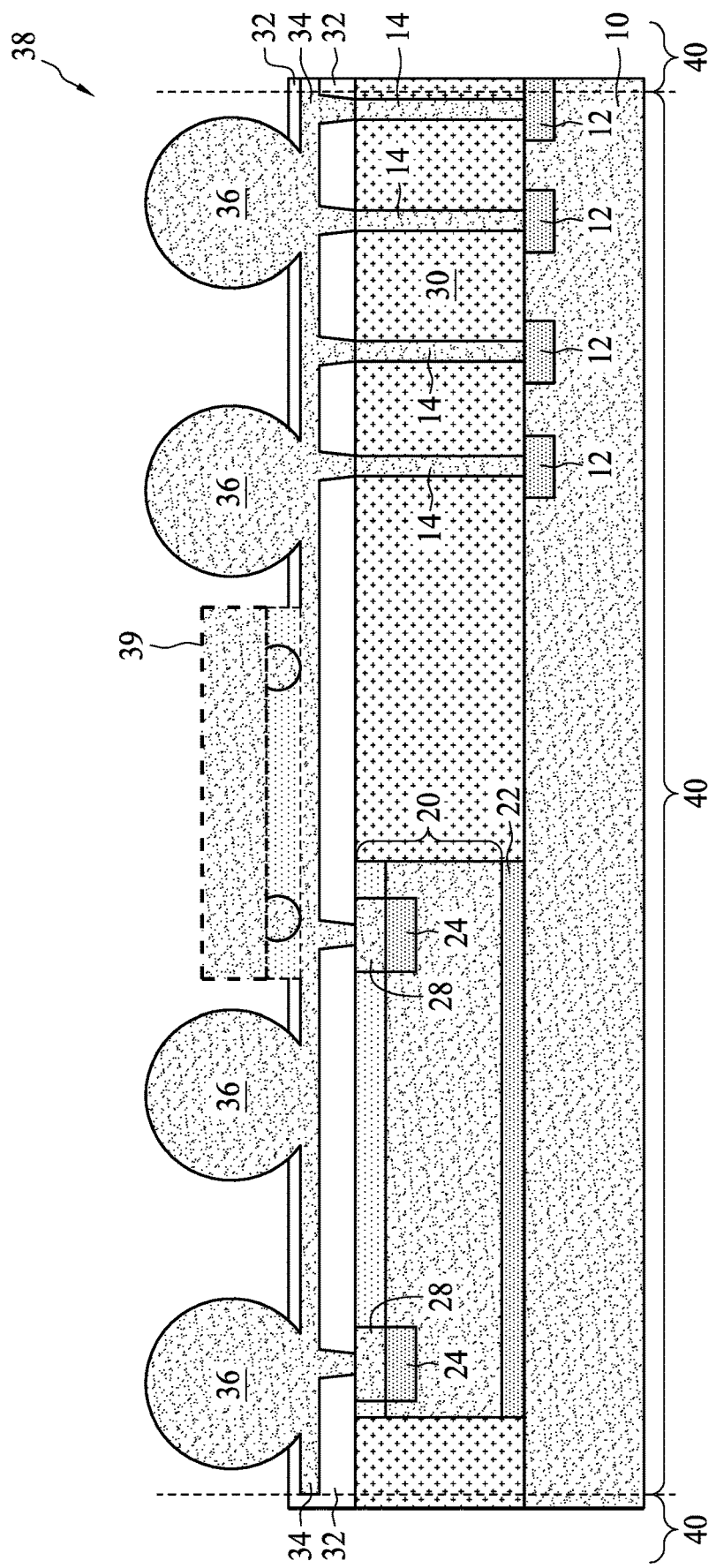
Figure 3I:
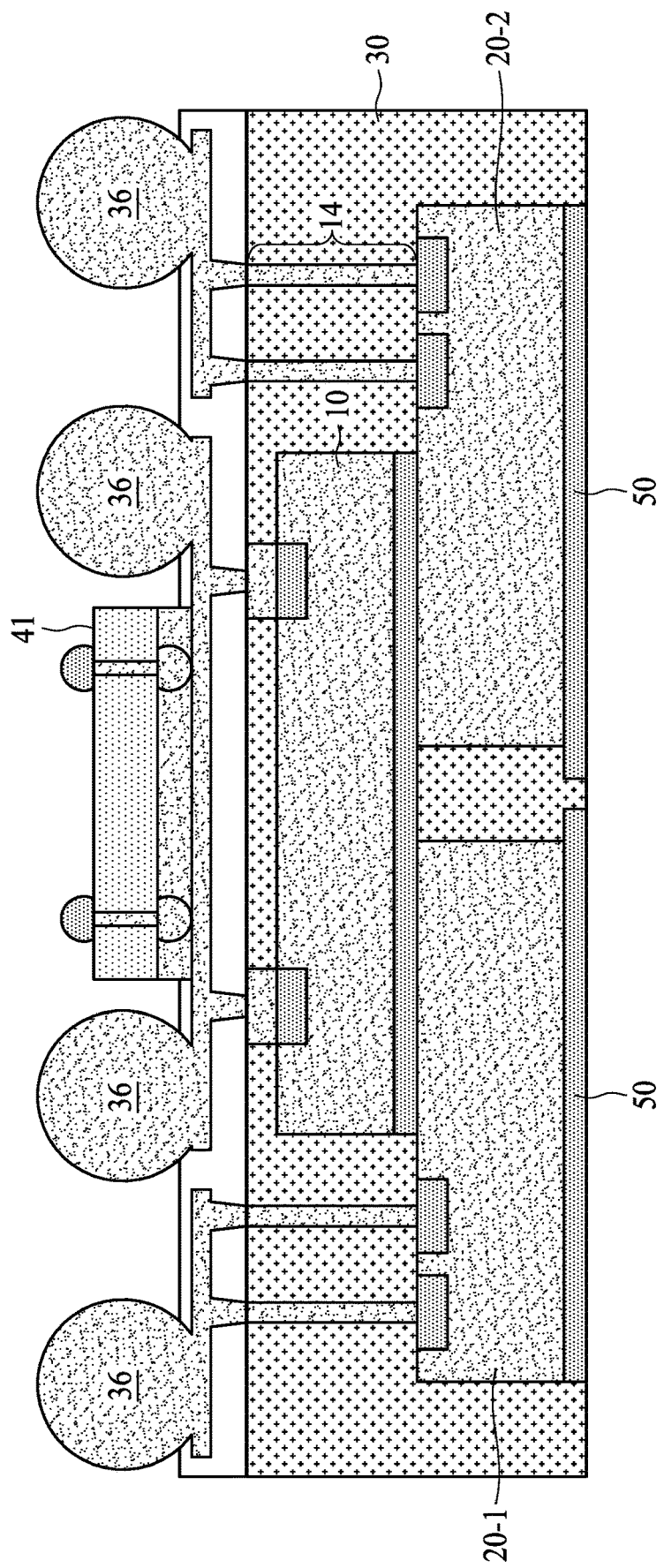
Figure 3J:
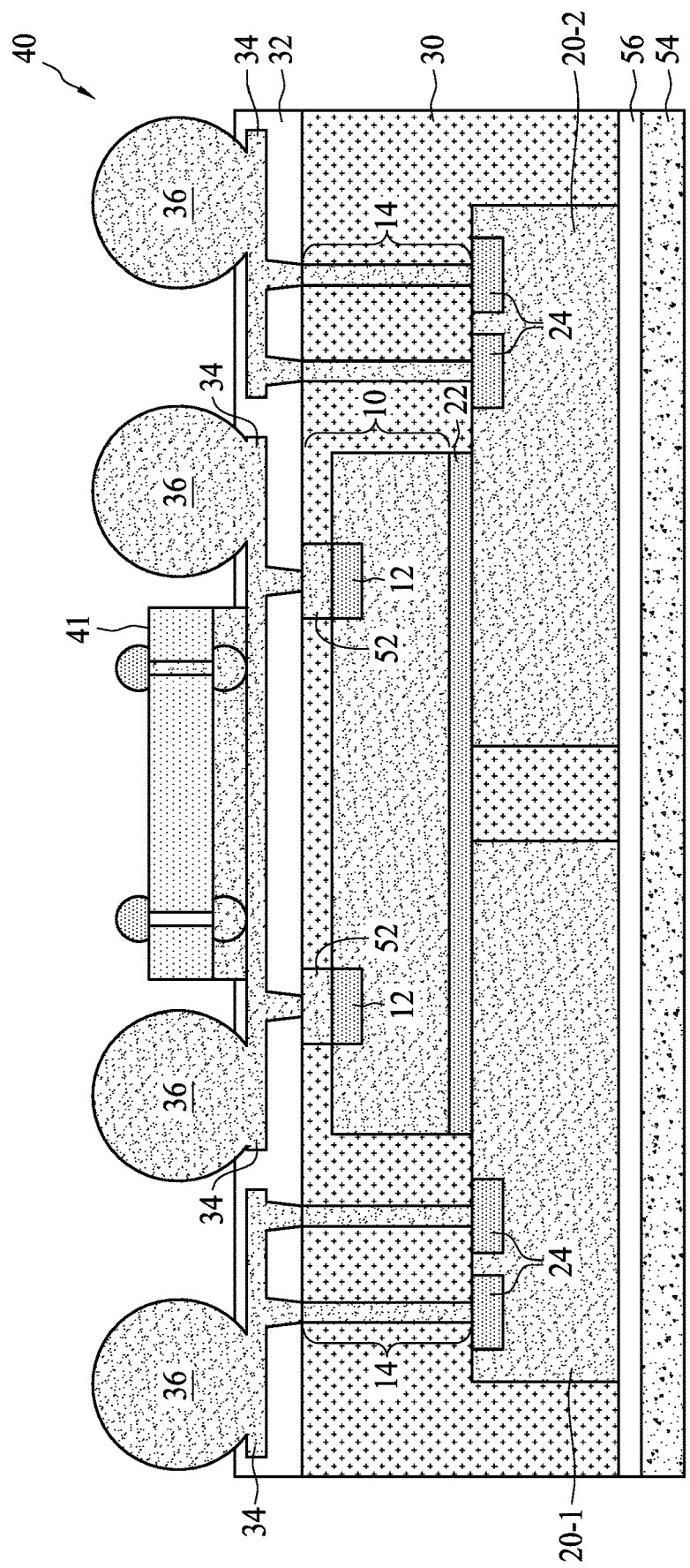

Carrier 46 is then de-bonded from the overlying structure, and the resulting structure is shown in FIG. 3I. In subsequent steps, device dies 20-1 and 20-2 are grinded from the backside, and DAFs 50 are removed through grinding. The resulting structure is shown in FIG. 3J. FIG. 3J further illustrates the attachment of lid 54 to device dies 20, for example, through Thermal Interface Material (TIM) 56. TIM 56 has thermal conductivity higher than the thermal conductivity of DAFs 22 (FIGS. 1I, 2I, and 3J). For example, the thermal conductivity of TIM 56 may be higher than about 1 W/m*K or even higher. Lid 54 may be formed of a material having good thermal conductivity. In accordance with some exemplary embodiments, lid 54 includes a metal such as aluminum, copper, an aluminum/copper alloy, stainless steel, or the like.

FIGS. 4A through 4J illustrate the formation of package 40 (FIG. 4J) in accordance with some embodiments. These embodiments are essentially the same as the embodiments shown in FIGS. 3A through 3J, except device die 10 does not have the metal pillars 52 (FIG. 3J) that are formed over metal pads 12. A brief discussion of the formation process is provided below. The details of these embodiments may be found in the embodiments in FIGS. 3A through 3J, and are not repeated herein.

Figure 4A:
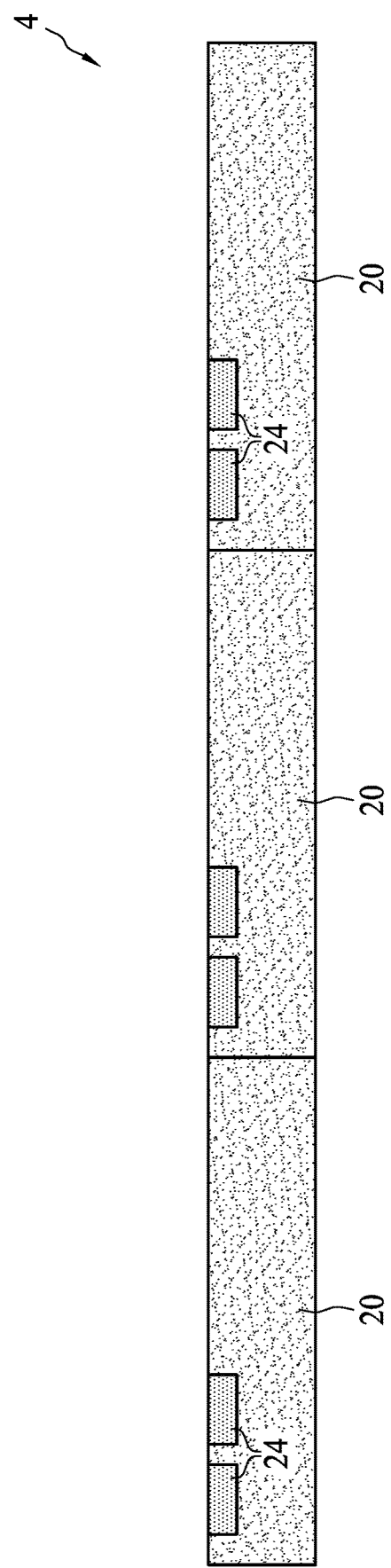
FIGS. 4A through 4J illustrate the cross-sectional views of intermediate stages in the formation of a fan-out package in accordance with some embodiments.
Figure 4B:
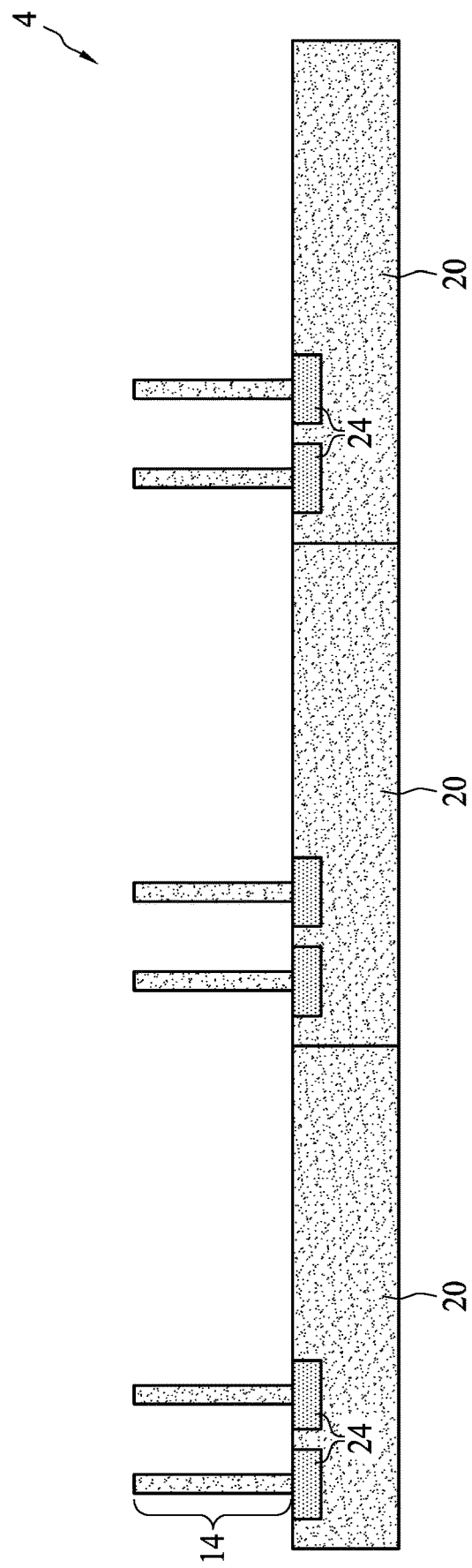
Figure 4C:
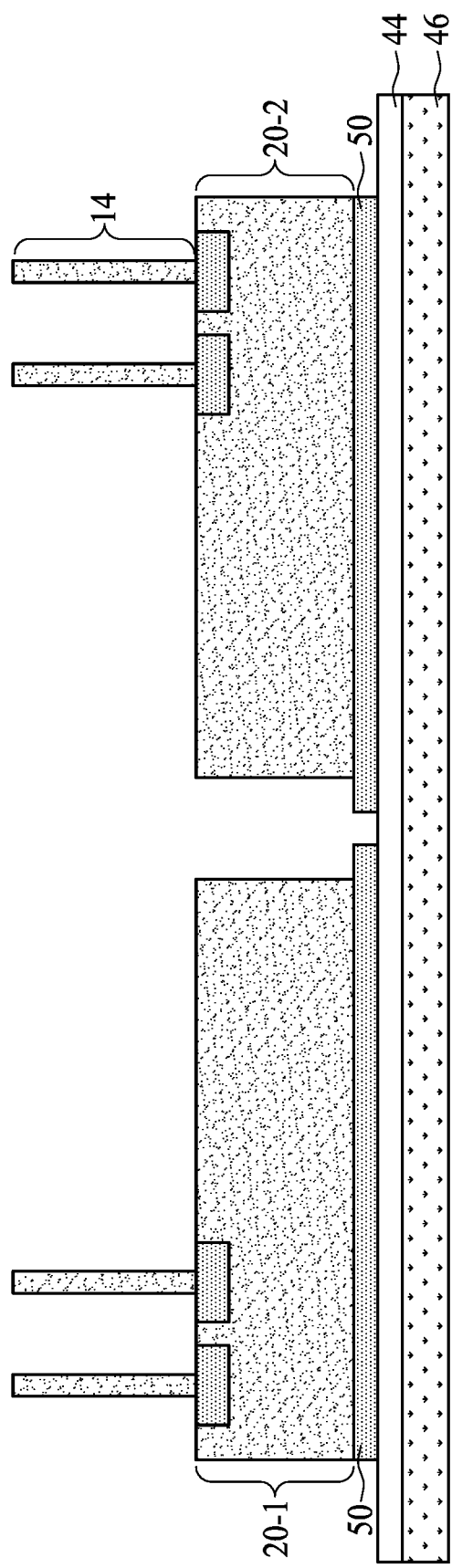
Figure 4D:
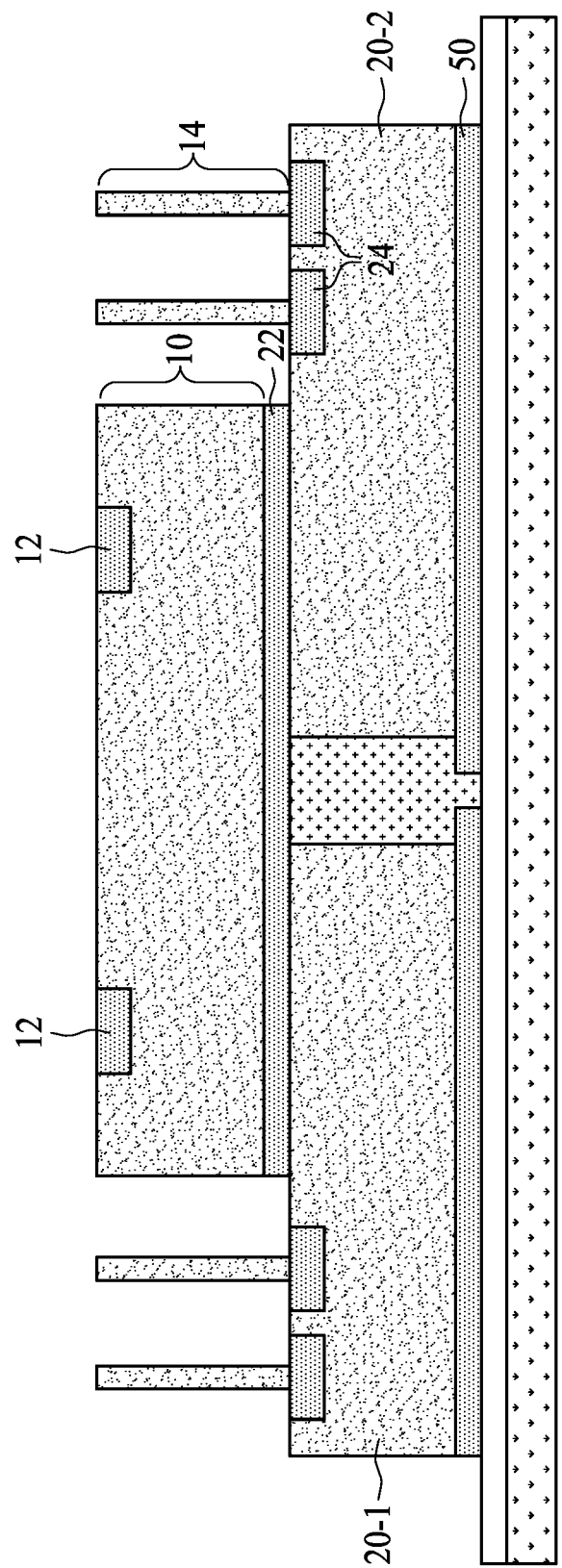

The steps shown in FIGS. 4A through 4C are essentially the same as the steps shown in FIGS. 3A through 3C. Next, as shown in FIG. 4D, device die 10 is adhered to device dies 20 (including 20-1 and 20-2). Device die 10 includes metal pads 12 as the top surface conductive features, and no metal pillars are formed over metal pads 12. Device 10 is also placed between the through-vias 14 directly over device die 20-1 and the through-vias 14 directly over device die 20-2.

Figure 4E:
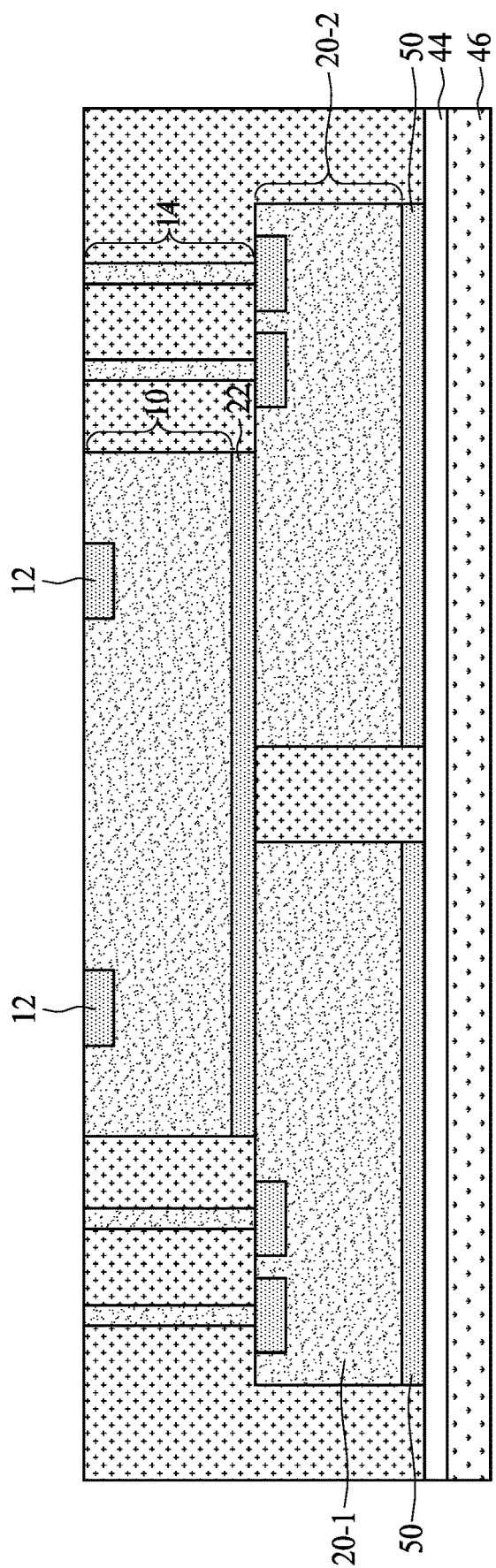
Figure 4F:
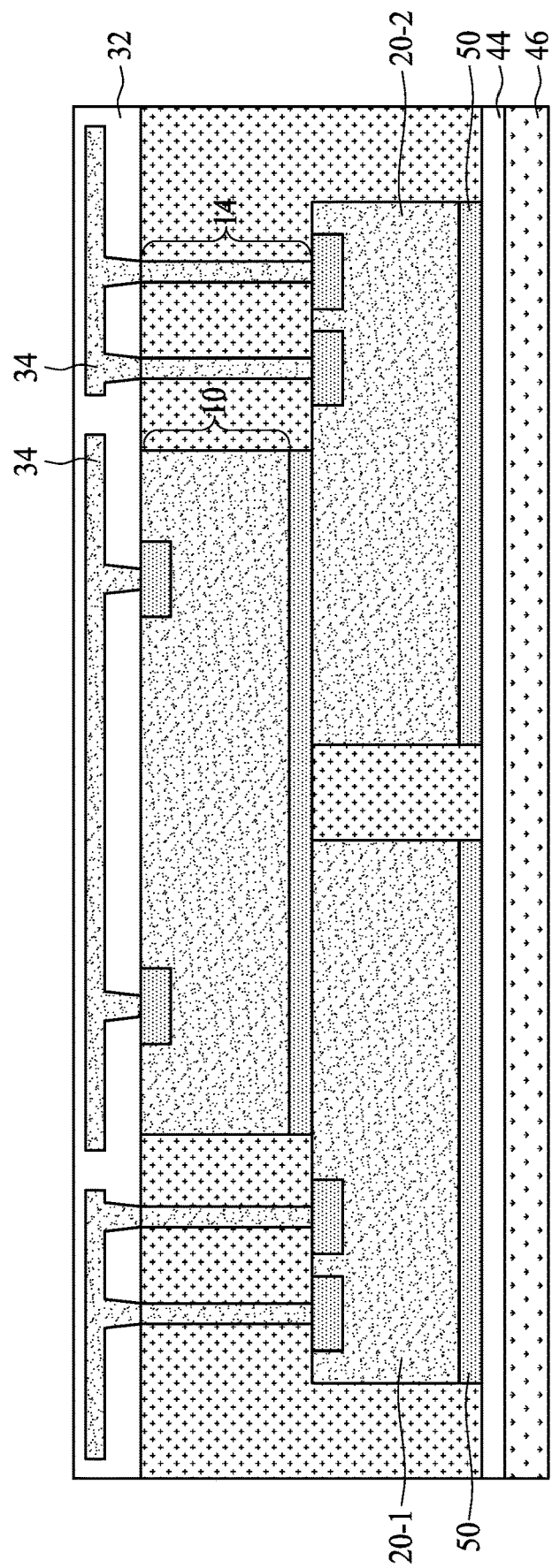
Figure 4G:
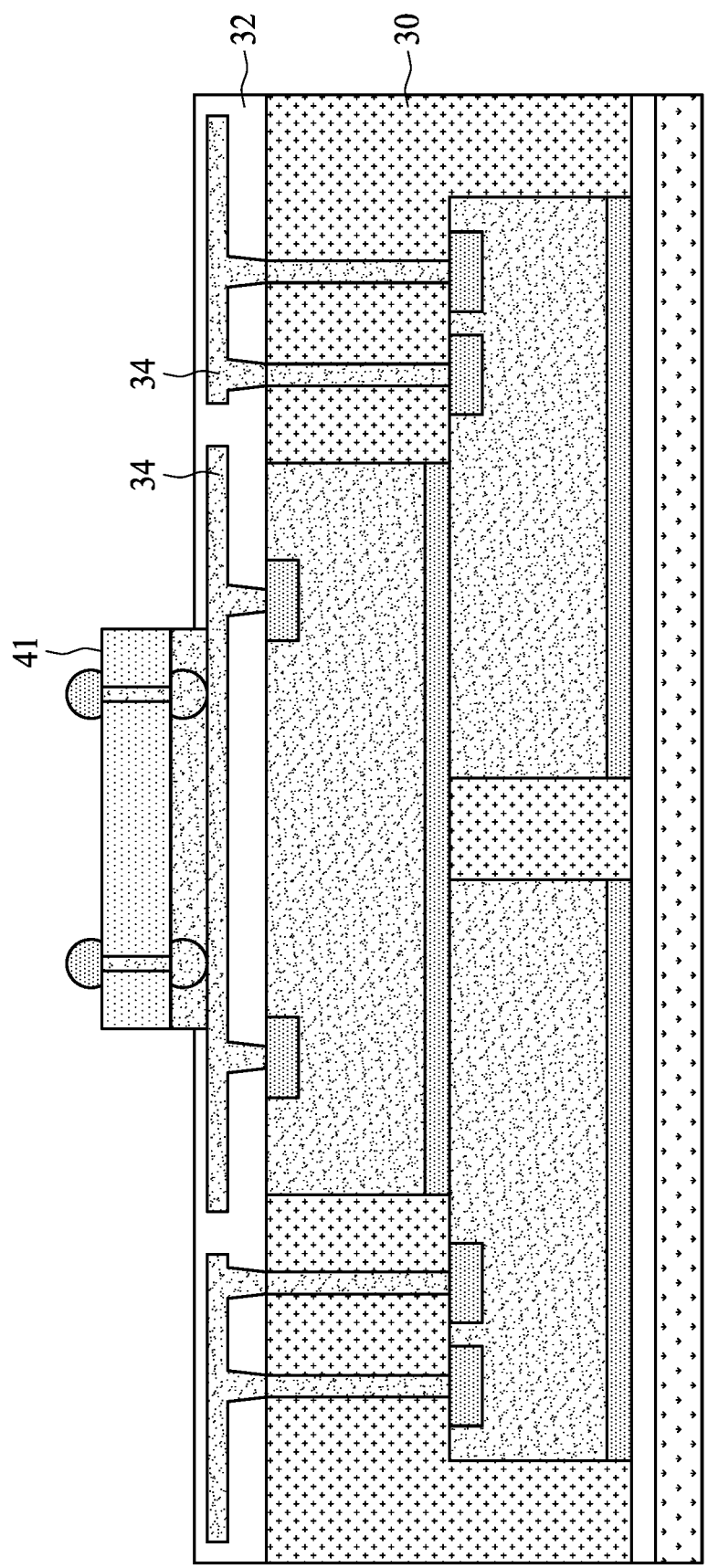
Figure 4H:
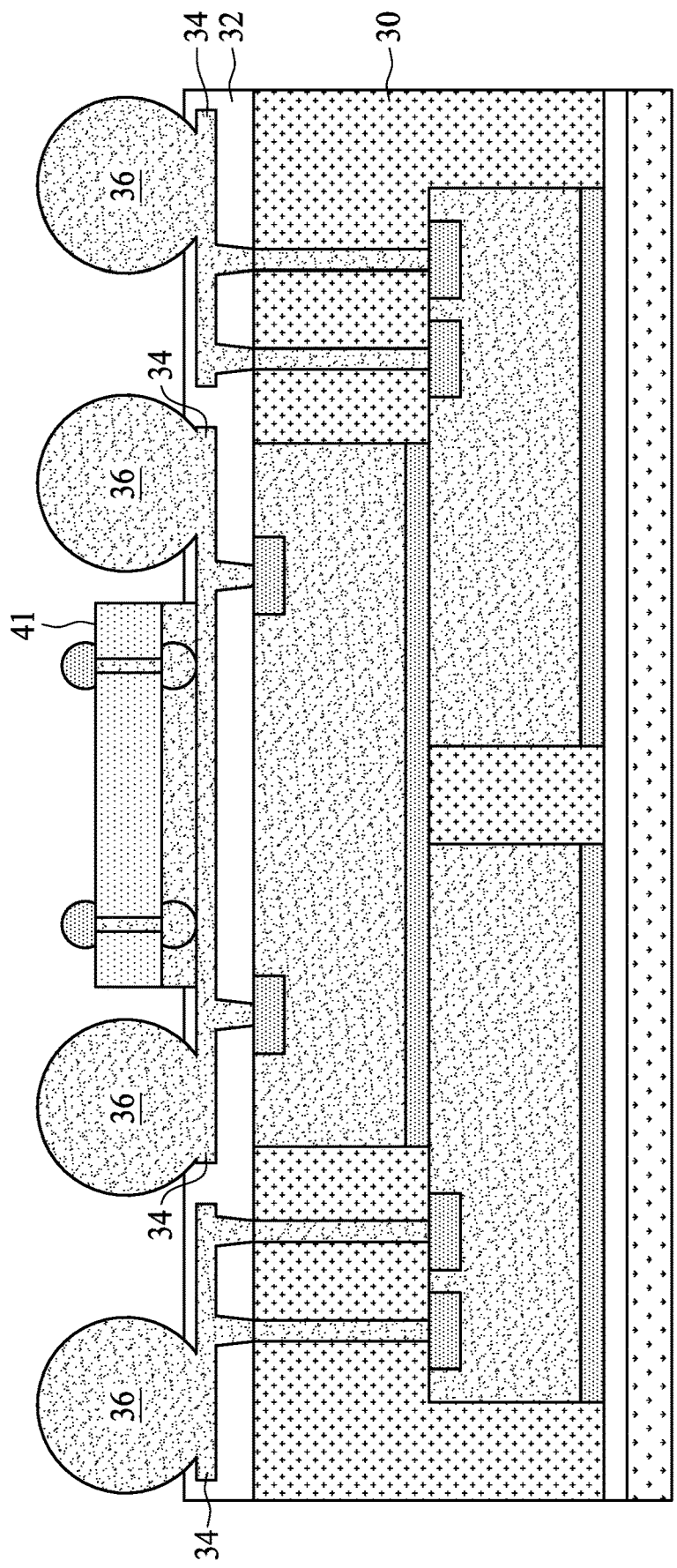
Figure 4I:
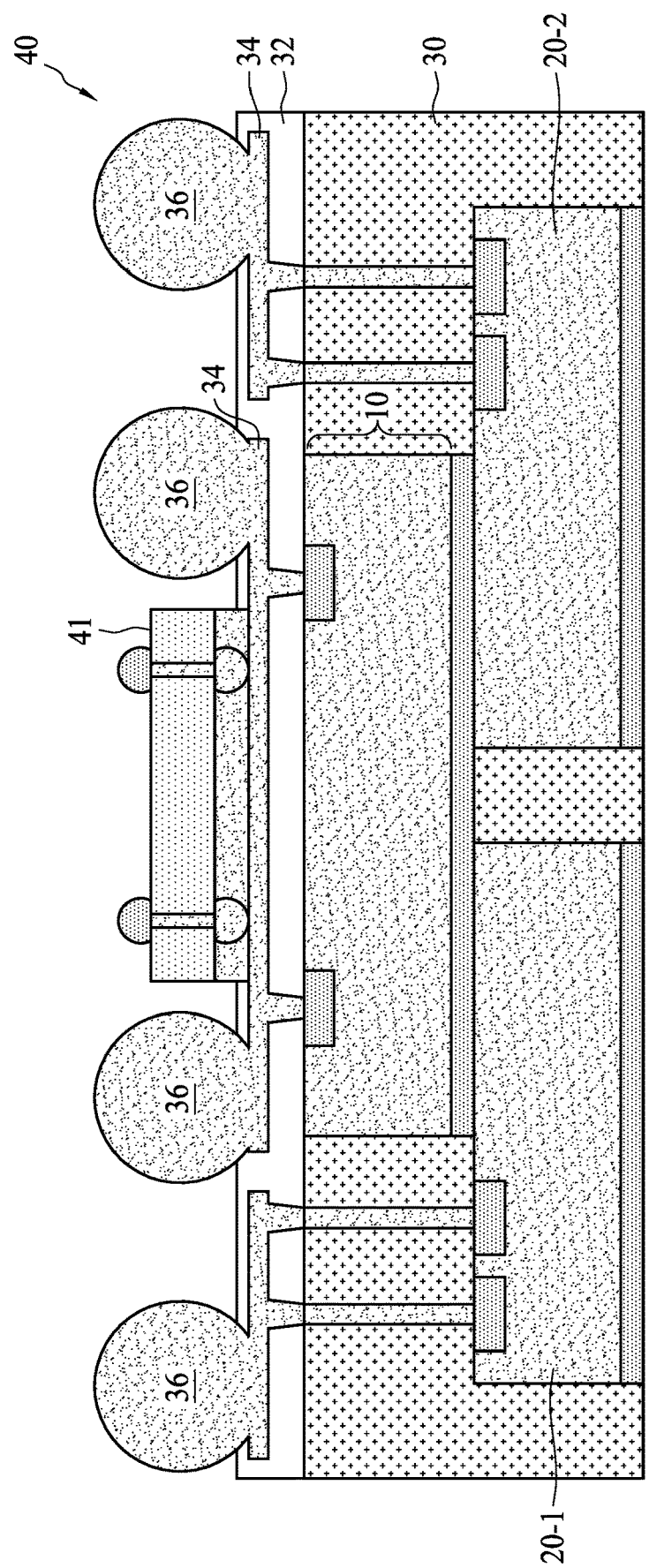
Figure 4J:
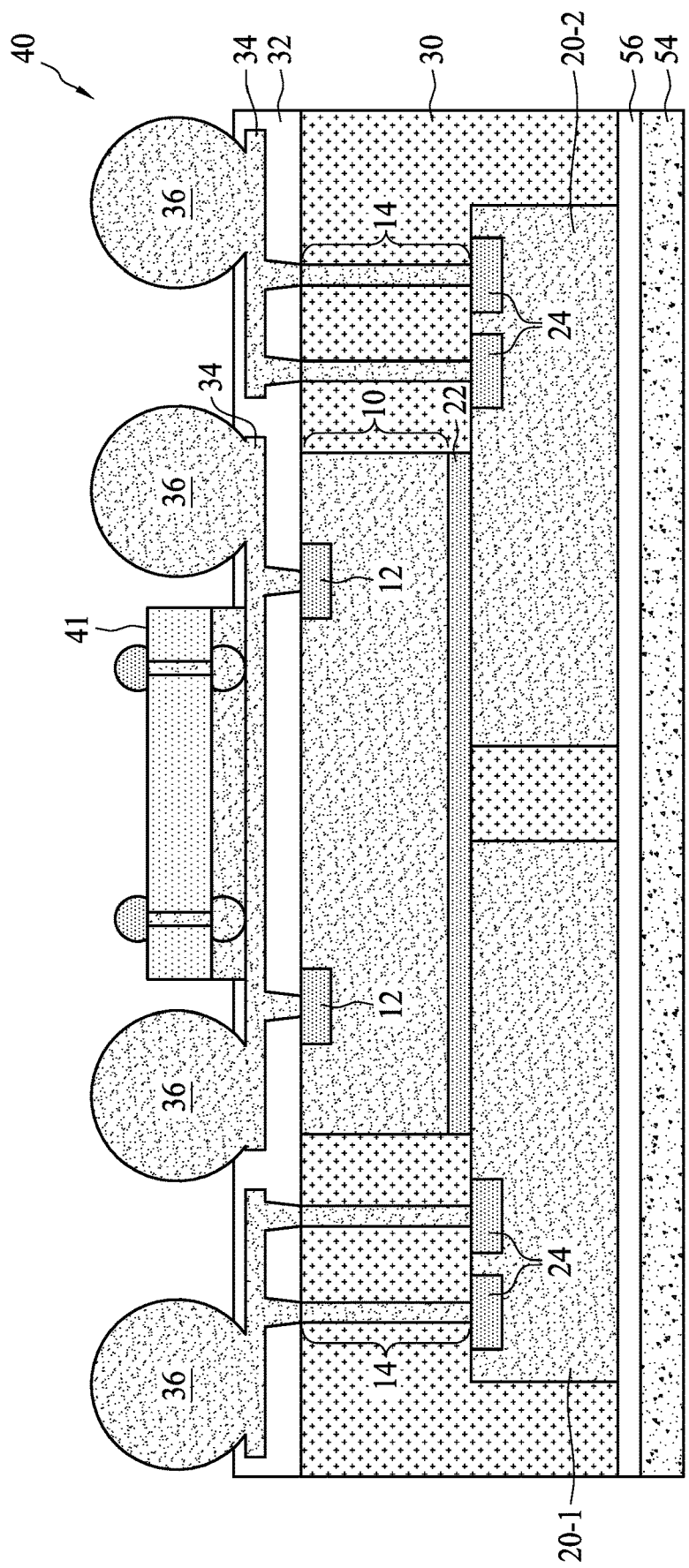

FIG. 4E illustrates the direct formation of encapsulating material 30 while exposing metal pads 12 and through-vias 14 without planarization. The process steps shown in FIGS. 4F through 4J are essentially the same as the process steps shown in FIGS. 3F through 3J, and the details are not repeated herein.

Figure 5:
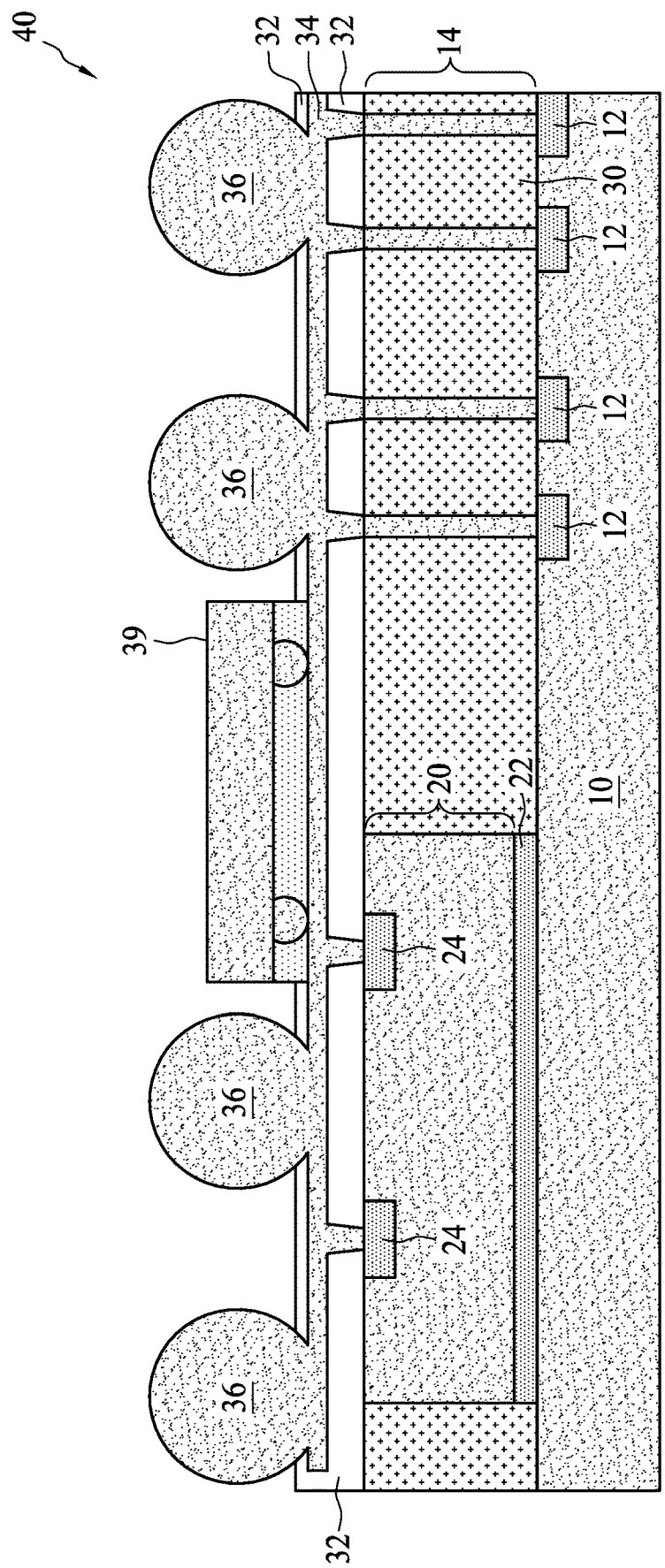
FIGS. 5 through 10 illustrate the cross-sectional views of fan-out packages in accordance with some embodiments.

FIGS. 5 through 10 illustrate the packages formed in accordance with some embodiments of the present disclosure. The formation process may be understood from the embodiments in FIGS. 1A through 4J. The package 40 shown in FIG. 5 is similar to the package shown in FIG. 1I, except in FIG. 5, no metal pillars are formed, and metal pads 24 are the top conductive features of die 20. RDLs 34 include vias that are in physical contact with metal pads 24.

Figure 6:
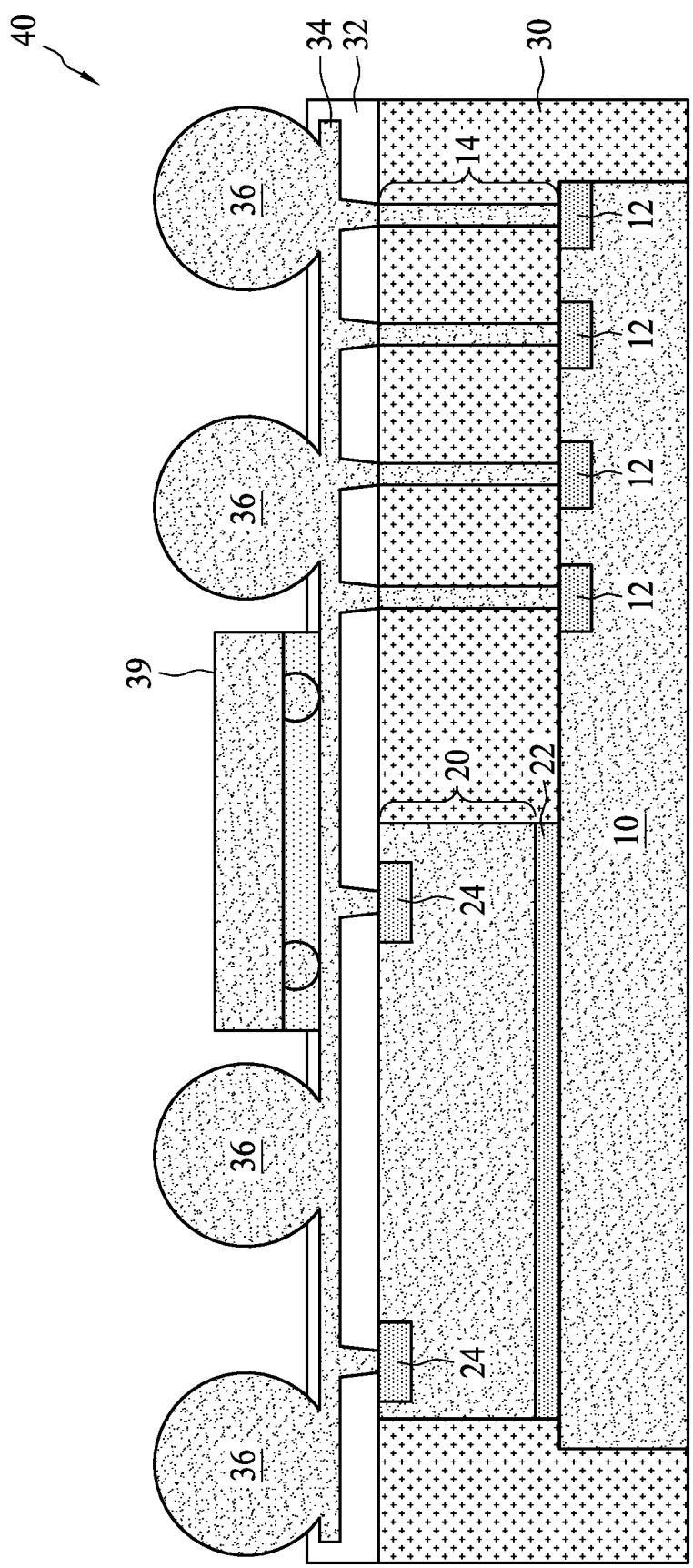

The package 40 shown in FIG. 6 is similar to the package shown in FIG. 2I, except in FIG. 6, no metal pillars are formed, and metal pads 24 are the top conductive features of die 20. RDLs 34 include vias that are in physical contact with metal pads 24.

Figure 7:
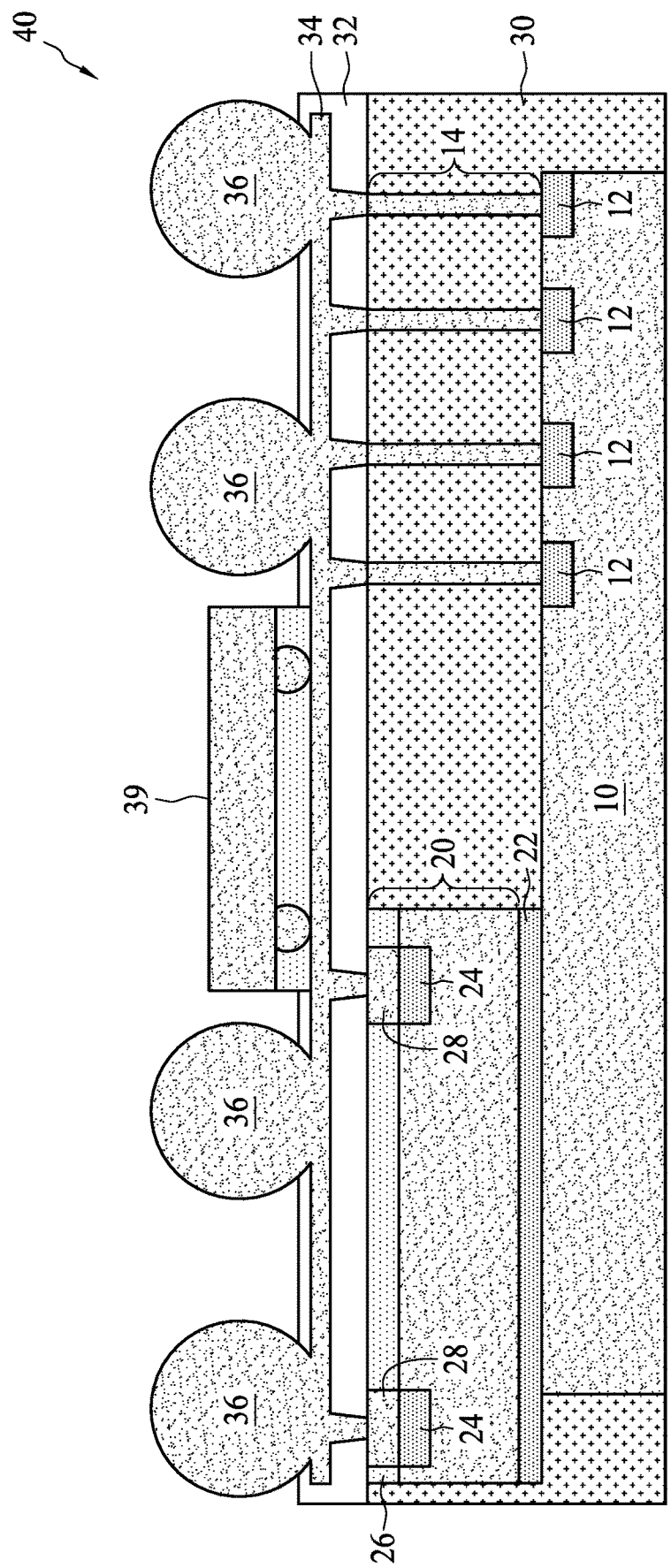
Figure 8:
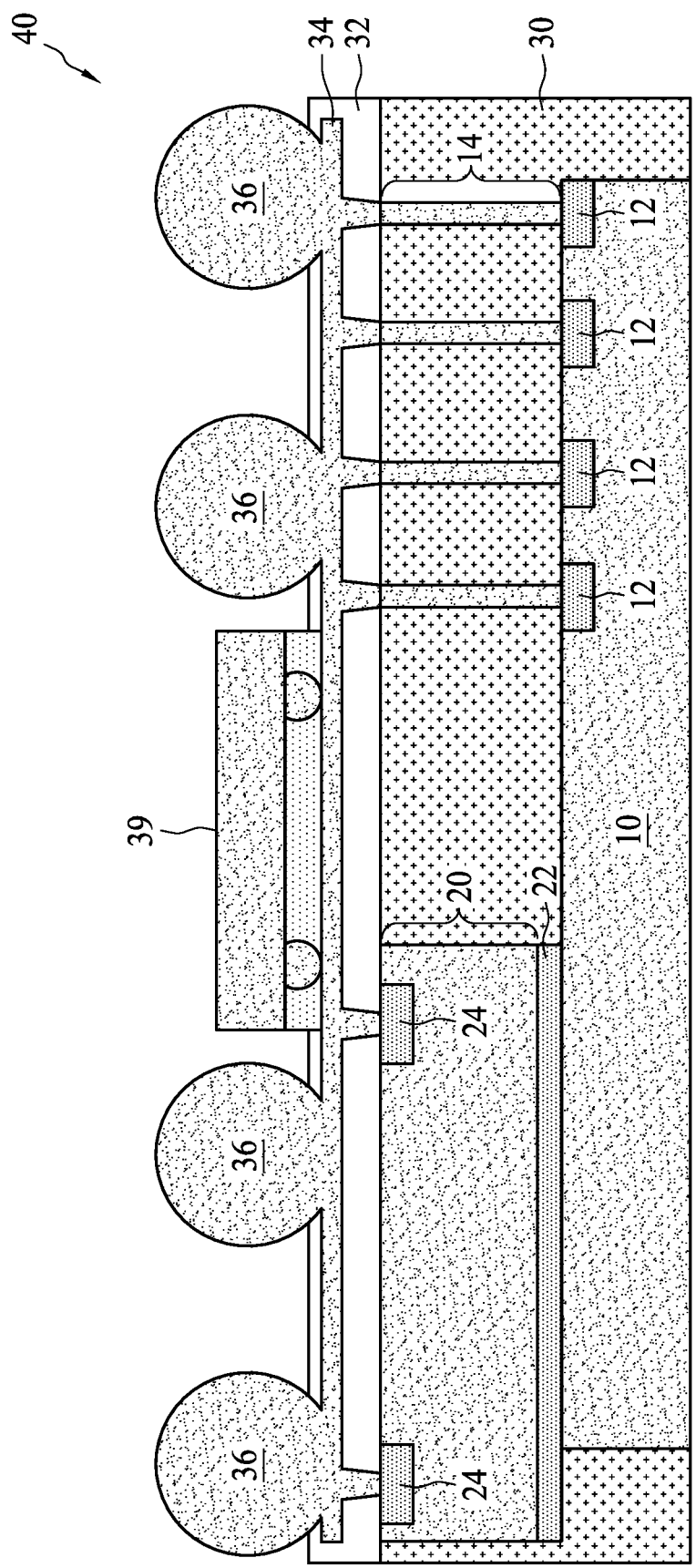

FIG. 7 illustrates package 40, which is similar to the package 40 in FIG. 2I, except device die 20 is partially offset from device die 10. With the partial offset, a first portion of device die 20 overlaps a portion of encapsulating material 30, and does not overlap any portion of device die 10. A second portion of device die 20 overlaps a portion of device die 10. The first portion of device die 20 is thus suspended with no underlying support of device die 10. The partial offset of device die 20 relative to device die 10 advantageously reduces the overlap area of device dies 10 and 20. Accordingly, an increased percentage of the top surface area of device die 10 can be used for forming metal pads 12 and through-vias 14, rather than being overlapped by device die 20. The offset of device die 20 from device die 10, however, does not result in the undesirable increase in the form factor (the top-view area) of package 40 in accordance with some embodiments. For example, when the top-view area of package 40 is determined by the area required to fit all electrical connectors 36, as long as the total footprint area of device dies 10 and 20 does not exceed the area required to fit all electrical connectors 36, the partial offset of device die 20 from device die 10 will not cause the increase in the form factor (the top view area). FIG. 8 illustrates package 40 similar to what is shown in FIG. 7, except no metal pillars are formed over metal pads 24.

Figure 9:
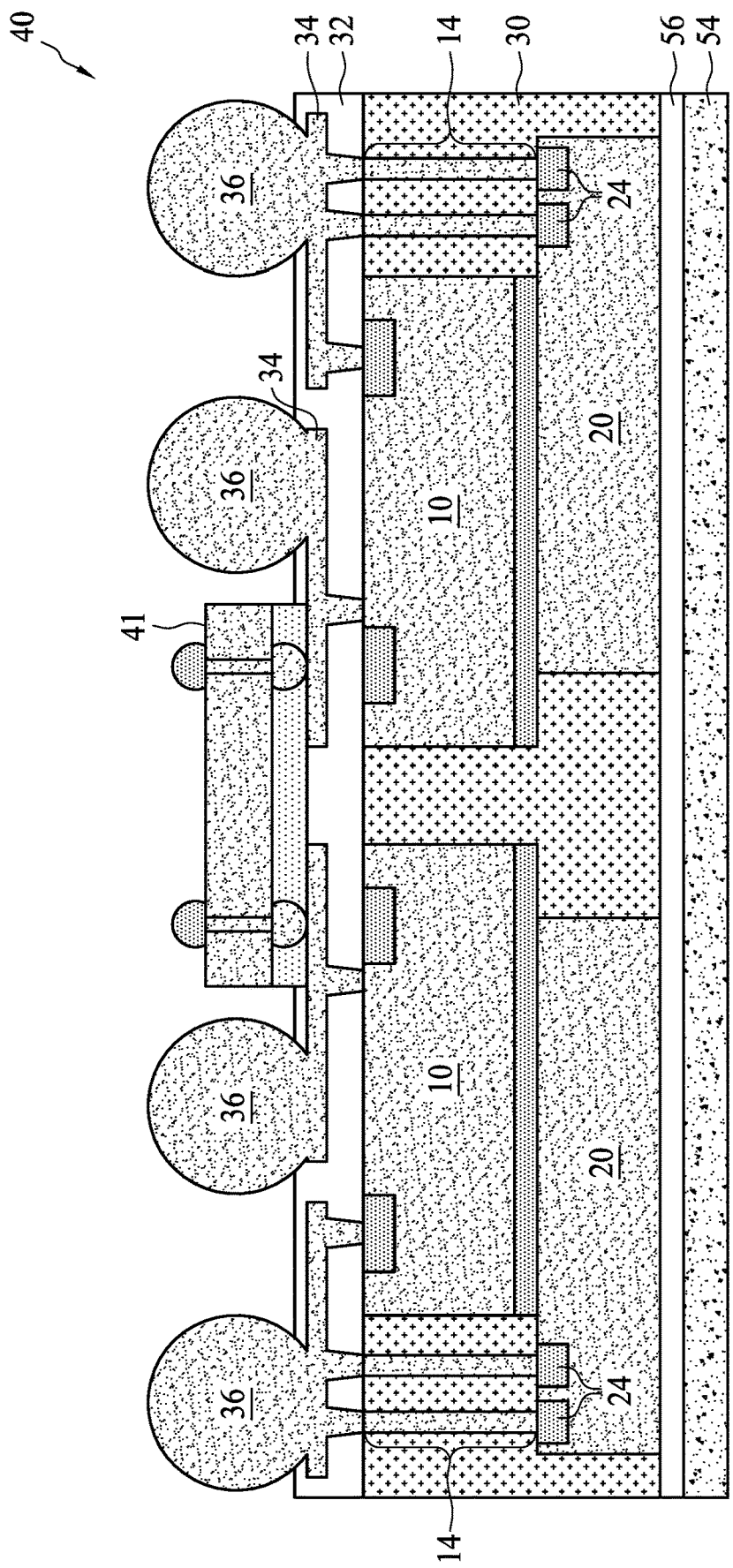

FIG. 9 illustrates package 40 in accordance with some embodiments, wherein there are two device dies 10 and two device dies 20 partially offset from the respective device dies 10. Each device die 10 has a first portion overlapping a portion of a respective underlying device die 20, and a second portion offset from the respective underlying device die 20. Through-vias 14 are formed directly on metal pads 24 of each of device dies 20.

Figure 10:
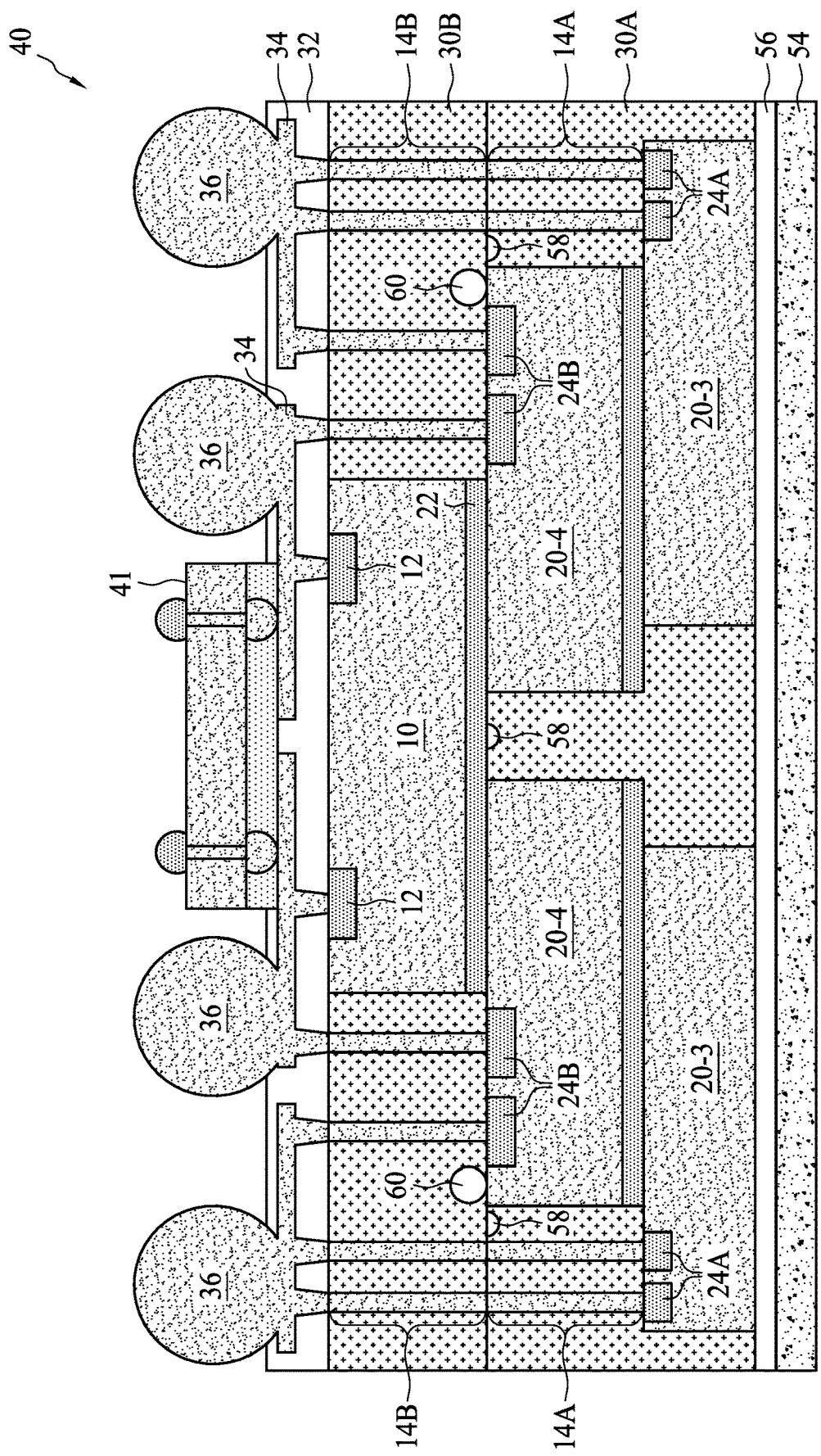

FIG. 10 illustrates package 40 in accordance with some embodiments, wherein there are four device dies 20 (including 20-3 and 20-4), and one device die 10. The four device dies 20 includes two higher-level device dies 20-4, and two lower-level device dies 20-3 underlying the higher-level device dies 20-4. Each of the higher-level device dies 20-4 has a first portion overlapping a portion of the respective underlying lower-level device die 20-3, and a second portion offset from the respective underlying lower-level device die 20-3. Four device dies 20 are encapsulated in a first encapsulating material 30A in a first encapsulating process.

Device die 10 is over higher-level device dies 20-4, and is encapsulated in a second encapsulating material 30B in a second encapsulating process. Device die 10 is partially offset from both higher-level device dies 20-4. For example, device die 10 has first portions overlapping portions of higher-level device die 20-4, and a second portion overlapping the gap between higher-level device die 20-4.

Encapsulating materials 30A and 30B may be the same as each other or different from each other. Through-vias 14A are formed directly on metal pads 24A of lower-level device dies 20-3. Some of through-vias 14B are formed directly on metal pads 24B of higher-level device dies 20-4. The interface of encapsulating materials 30A and 30B may be distinguishable from each other due to the CMP performed on the top surface of encapsulating material 30A, which causes some of the sphere-shaped fillers 58 in encapsulating material 30A to be grinded to have planar (rather than spherical) top surfaces. On the other hand, the sphere-shaped fillers 60 that are in encapsulating material 30B and in contact with encapsulating material 30A remain to have rounded shapes. Furthermore, due to the nature of the formation process of through-vias 14A and 14B, each of through-vias 14A and 14B may have a top width greater than the respective bottom width. The transition of through-vias 14B to the respective underlying through-vias 14A will also show discontinuity, and the top widths of through-vias 14A may be greater than the bottom widths of the respective overlying through-vias 14B.

In FIGS. 9 and 10, the partial offset of higher-level die(s) from the lower-level dies results in the advantageous increase in the surface area of the lower-level dies 20-3 that can be used for forming metal pads and through-vias. On the other hand, since the lower-level dies 20-3 occupy the majority top-view area of package 40, the warpage of package 40 is not severe.

The embodiments of the present disclosure have some advantageous features. By forming through-vias directly on the metal pads of the lower-level die, package substrate is not used, and the resulting package is thin. The thermal decoupling of the logic die and memory die by using DAF prevents the memory die from the performance degradation caused by the heat generated in the logic die. The top-view area of the package is minimized. A higher-level die and a lower-level die may be encapsulated by a same encapsulation process, and hence the cost and the warpage of the package are reduced.

In accordance with some embodiments of the present disclosure, a method includes forming a through-via from a first conductive pad of a first device die. The first conductive pad is at a top surface of the first device die. A second device die is adhered to the top surface of the first device die. The second device die has a surface conductive feature. The second device die and the through-via are encapsulated in an encapsulating material. The encapsulating material is planarized to reveal the through-via and the surface conductive feature. Redistribution lines are formed over and electrically coupled to the through-via and the surface conductive feature.

In accordance with some embodiments of the present disclosure, a method includes forming a first through-via on a first conductive pad of a first device die, forming a second through-via on a second conductive pad of a second device die, placing the first device die and the second device die over a carrier, and adhering a third device die to a top surface of the first device die and a top surface of the second device die. The method further includes encapsulating the third device die, the first through-via, and the second through-via in an encapsulating material, planarizing the encapsulating material to reveal the first through-via, the second through-via, and the surface conductive feature of the third device die, and forming redistribution lines over and electrically coupling to the first through-via, the second through-via, and the third device die.

In accordance with some embodiments of the present disclosure, a method includes forming a first through-via on a top surface of a first device die, forming a second through-via on a top surface of a second device die, placing the first device die and the second device die over a carrier, and adhering a third device die to the top surface of the first device die and the top surface of the second device die. The third device die is between the first through-via and the second through-via. A front surface of the first device die and a front surface of the second device die face a back surface of the third device die. The method further includes in a same encapsulating process, encapsulating the first device die, the second device die, the third device die, the first through-via, and the second through-via in an encapsulating material. The encapsulating material is planarized to reveal the first through-via, the second through-via, and a surface conductive feature of the third device die. Redistribution lines are formed over and electrically coupled to the first through-via, the second through-via, and the surface conductive feature of the third device die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A package comprising:
a lid;
a thermal interface material over and contacting the lid;
a first device die and a second device die over the thermal interface material;
a first encapsulant encapsulating the first device die and the second device die therein;
a first die-attach film comprising a first bottom surface contacting a first top surface of the first device die and a second top surface of the second device die;

a third device die comprising a second bottom surface adhered to a third top surface of the first die-attach film;

a second encapsulant encapsulating the third device die therein;

a first through-via penetrating through the second encapsulant; and a redistribution structure over and electrically coupling to the first device die, the second device die, and the third device die.

2. The package of claim 1 further comprising a second through-via penetrating through the first encapsulant, wherein the first through-via is joined to the second through-via to form a distinguishable interface in between.

3. The package of claim 1, wherein top surfaces of the first through-via and the second encapsulant are coplanar with each other, and bottom surfaces of the first through-via and the second encapsulant are coplanar with each other.

4. The package of claim 1 further comprising:
a second die-attach film underlying and contacting the first device die;
a fourth device die underlying and contacting the second die-attach film; and
an additional through-via contacting a top surface of a conductive feature in the fourth device die.

5. The package of claim 4, wherein the first encapsulant extends to a level lower than the second die-attach film.

6. The package of claim 5, wherein the first encapsulant further encapsulates the fourth device die therein.

7. The package of claim 4, wherein both of the first device die and the second die-attach film extend laterally beyond an edge of the fourth device die.

8. The package of claim 4, wherein an additional bottom surface of the second die-attach film further contacts an additional top surface of the first encapsulant.

9. The package of claim 8, wherein the additional bottom surface of the second die-attach film forms a horizontal interface with the additional top surface of the first encapsulant.

10. The package of claim 1, wherein:
the first device die comprises a first lower part and a first upper part over the first lower part, with the first lower part comprising first active devices, and the first upper part comprising a first routing layer; and
the second device die comprises a second lower part and a second upper part over the second lower part, with the second lower part comprising second active devices, and the second upper part comprising a second routing layer, wherein the first lower part is identical to the second lower part, and the first upper part is different from the second upper part.

11. The package of claim 1 further comprising a third through-via extending from a top surface of the second encapsulant to a conductive feature of the first device die, wherein the first device die is electrically coupled to both of the first through-via and the third through-via.

12. A package comprising:
a first device die comprising:
a first part comprising a first edge;
a second part comprising a second edge opposite to the first edge; and
a conductive pad in the first part;
a first through-via over and connected to the conductive pad;
a second device die;
a first die-attach film over and contacting both of the first device die and the second device die;
a third device die over and contacting the first die-attach film, wherein both of the third device die and the first die-attach film overlap the second part of the first device die; and
an encapsulant encapsulating the first device die, the second device die, the third device die, and the first through-via therein, wherein a bottom surface of the first die-attach film further contacts a top surface of the encapsulant to form a horizontal interface, and wherein the second edge of the first device die overlaps a part of the encapsulant.

* * * * *